(12) United States Patent
Ipposhi et al.

(10) Patent No.: US 6,798,021 B2
(45) Date of Patent: Sep. 28, 2004

(54) TRANSISTOR HAVING A GRADED ACTIVE LAYER AND AN SOI BASED CAPACITOR

(75) Inventors: Takashi Ipposhi, Tokyo (JP); Toshiaki Iwamatsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/291,703

(22) Filed: Nov. 12, 2002

(65) Prior Publication Data

US 2003/0218213 A1 Nov. 27, 2003

(30) Foreign Application Priority Data

May 23, 2002 (JP) ...................................... P2002-148648

(51) Int. Cl.[7] .............................................. H01L 29/00
(52) U.S. Cl. ....................................... 257/347; 257/350

(56) References Cited

PUBLICATIONS

Y. Hirano, et al. "Bulk–Layout–Compatible 0.18 μm SOI–C-MOS Technology Using Body–Fixed Partial Trench Isolation (PTI)," IEEE International SOI COnference, 1999, pp. 131–132.

S. Maeda, et al. "Impact of 0.18 μm SOI CMOS Technology Using Hybrid Trench Isolation With High Resistivity Substrate on Embedded RF/Analog Applications," 2000 Symposium on VLSI Technology Digest Of Technical Papers, 2000 IEEE, 2000, pp. 154–155.

*Primary Examiner*—Fetsum Abraham
(74) *Attorney, Agent, or Firm*—Oblon, Spivak, McClelland, Maier & Neustadt, P.C.

(57) ABSTRACT

By ion implantation process, a P-type impurity for element isolation is implanted at an impurity concentration (P1) into a silicon layer (3) defined between the bottom surface of an element isolation insulating film (5a) and the upper surface of a BOX layer (2). Resulting from this implantation, a P-type impurity is implanted at an impurity concentration (P2) into the silicon layer (3) under a gate oxide film (7a) and in the vicinity of an interface between the silicon layer (3) and the BOX layer (2). Under a capacitor dielectric film (7b) and in the vicinity of an interface between the silicon layer (3) and the BOX layer (2), the silicon layer (3) has an impurity concentration (P0) which is the initial concentration of itself.

6 Claims, 37 Drawing Sheets

F I G. 1
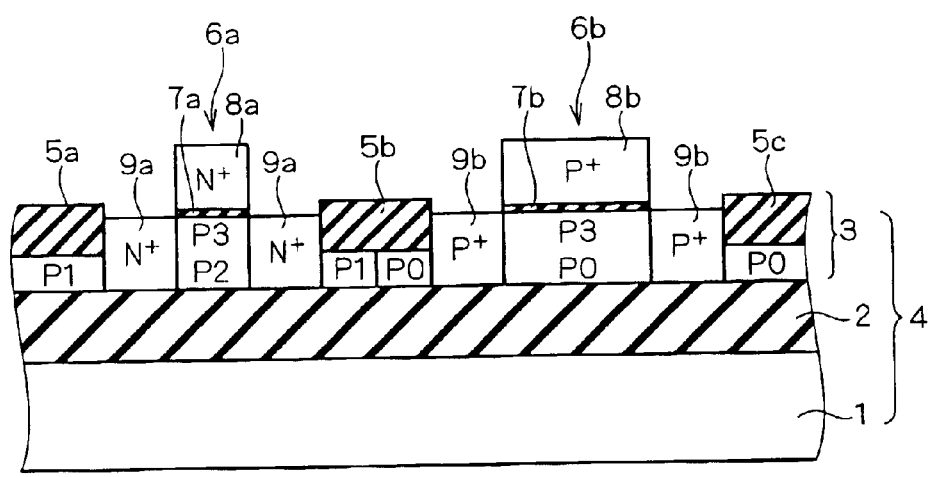

F I G. 5
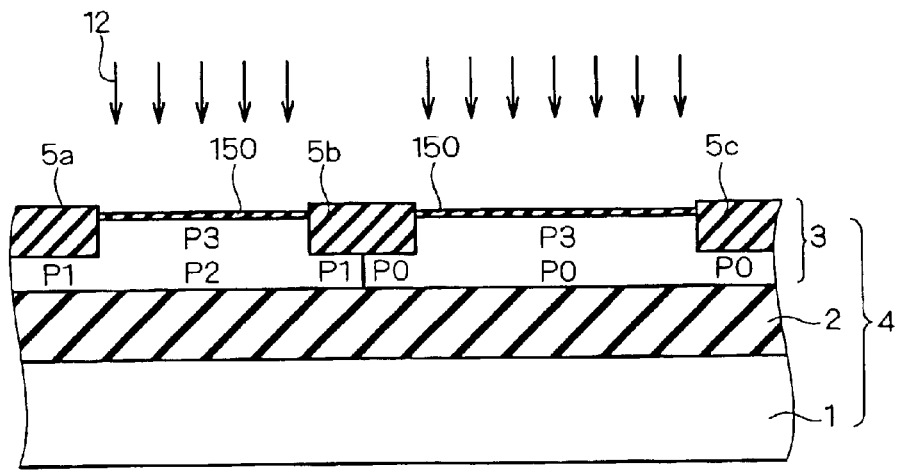
F I G. 6
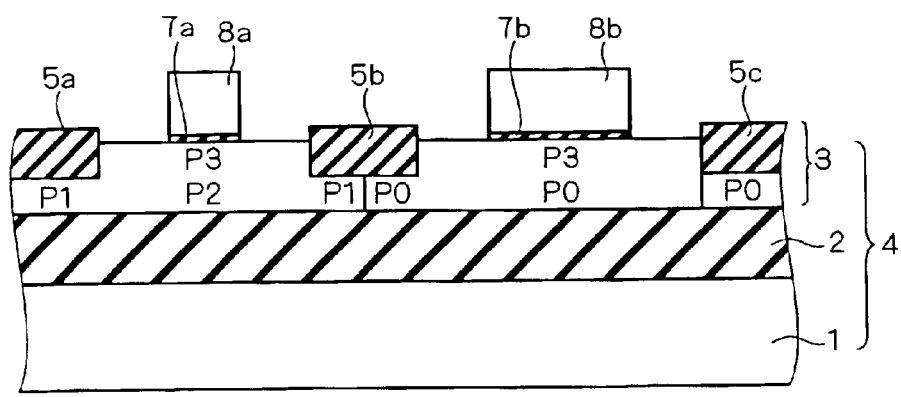

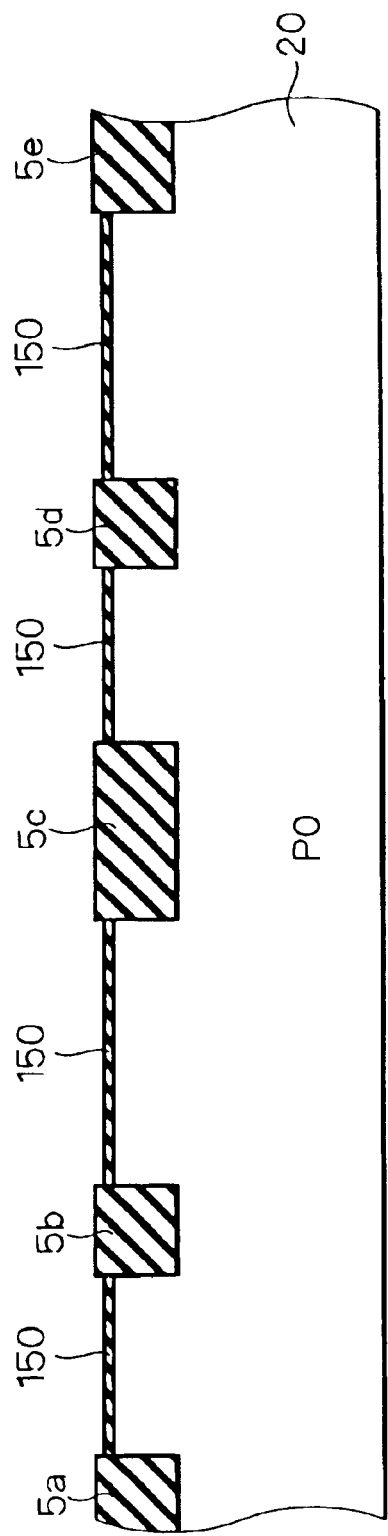

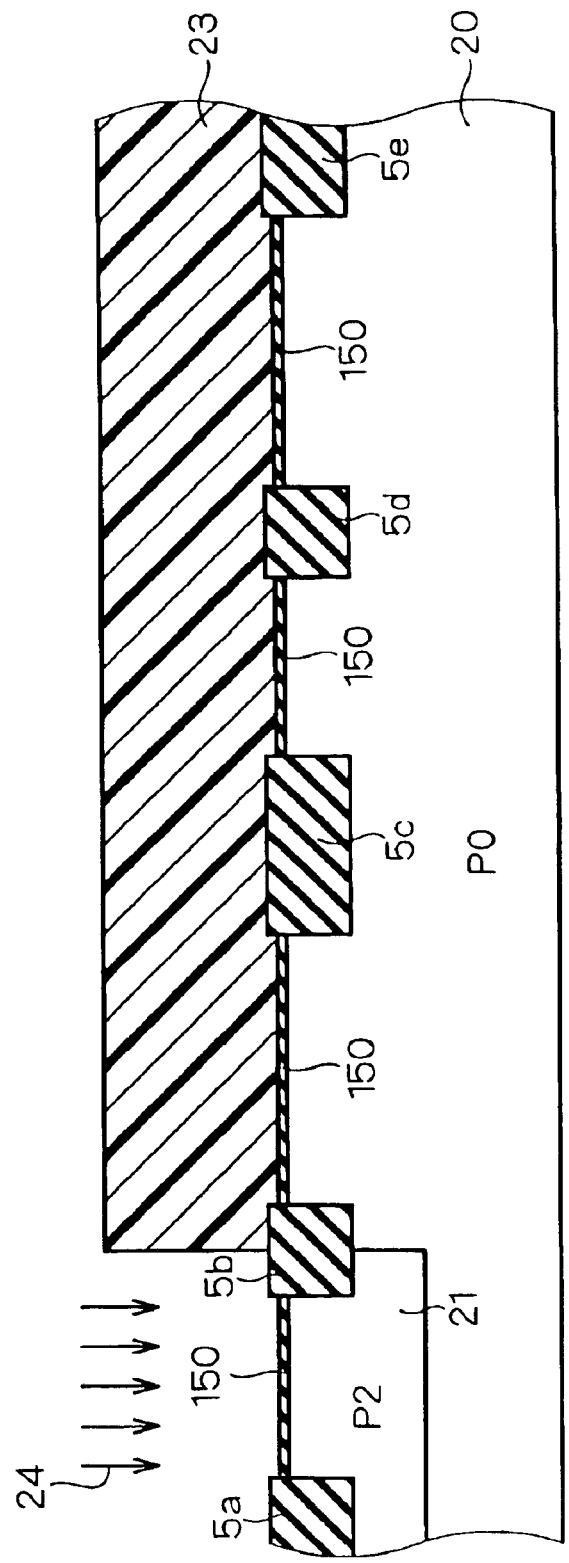

TRANSISTOR HAVING A GRADED ACTIVE LAYER AND AN SOI BASED CAPACITOR

BACKGROUND OF THE INVENTION

1. Field of the Invention

The present invention relates to a semiconductor device and a method of manufacturing the same. More particularly, it relates to a semiconductor device allowing improvement in reliability of an insulating film (more specifically, a capacitor dielectric film of an MOS capacitor or a gate insulating film of an MOSFET) formed on a substrate, and to a method of manufacturing the same.

2. Description of the Background Art

FIG. 42 is a sectional view illustrating the structure of a first semiconductor device in the prior art. The prior-art first semiconductor device includes an SOI substrate 104, element isolation insulating films 105a through 105e, an NMOSFET 106a, a PMOSFET 106c, and MOS capacitors 106b and 106d. The MOS capacitors 106b and 106d are usable as decoupling capacitors, for example. The SOI substrate 104 includes a silicon substrate 101, a BOX (buried oxide) layer 102, and a P-type silicon layer 103 stacked in this order. The element isolation insulating films 105a through 105e are partially provided in the upper surface of the silicon layer 103. Bottom surfaces of the element isolation insulating films 105a through 105e have no contact with the upper surface of the BOX layer 102. The element isolation insulating film arranged in this manner is called as "an element isolation insulating film of partial isolation type".

The NMOSFET 106a includes a gate oxide film 107a provided on the upper surface of the silicon layer 103, a gate electrode 108a, and a pair of N⁺-type source/drain regions 109a. The MOS capacitor 106b includes a capacitor dielectric film 107b provided on the upper surface of the silicon layer 103, a capacitor upper electrode 108b, and a pair of P⁺-type contact regions 109b. The PMOSFET 106c includes a gate oxide film 107c provided on the upper surface of the silicon layer 103, a gate electrode 108c, and a pair of P⁺-type source/drain regions 109c. The MOS capacitor 106d includes a capacitor dielectric film 107d provided on the upper surface of the silicon layer 103, a capacitor upper electrode 108d, and a pair of N⁺-type contact regions 109d.

By ion implantation process, a P-type impurity or N-type impurity for element isolation is implanted at an impurity concentration P1 or N1 into the silicon layer 103 defined between each bottom surface of the element isolation insulating films 105a through 105e and the upper surface of the BOX layer 102. Resulting from this implantation, a P-type impurity or N-type impurity is implanted at an impurity concentration P2 or N2 into the silicon layer 103 defined under the gate oxide films 107a, 107c and the capacitor dielectric films 107b, 107d, and in the vicinity of an interface between the silicon layer 103 and the BOX layer 102.

By ion implantation process, a P-type impurity or N-type impurity for controlling threshold voltage of the NMOSFET 106a or PMOSFET 106c is further implanted at an impurity concentration P3 or N3 into the upper surface of the silicon layer 103 defined under the gate oxide films 107a and 107c. Resulting from this implantation, a P-type impurity or N-type impurity is implanted at an impurity concentration of P3 or N3 into the upper surface of the silicon layer 103 defined under the capacitor dielectric films 107b and 107d.

FIG. 43 is a sectional view illustrating the structure of a second semiconductor device in the prior art. The prior-art second semiconductor device includes a P-type silicon substrate 110 having an impurity concentration P0, a P-type well 111 having an impurity concentration P2, an N-type well 112 having an impurity concentration N2, the element isolation insulating films 105a through 105e, the NMOSFET 106a, the PMOSFET 106c, and the MOS capacitors 106b and 106d. The P-type well 111 and the N-type well 112 are provided in the upper surface of the silicon substrate 110. The MOS capacitor 106b is provided on the P-type well 111, and the MOS capacitor 106d is provided on the N-type well 112.

As seen from the foregoing, in the first and second semiconductor devices of the prior art, the silicon layer 103 or the silicon substrate 110 bears the same impurity profile under the gate oxide film 107a and under the capacitor dielectric film 107b. Further, the silicon layer 103 or the silicon substrate 110 bears the same impurity profile under the gate oxide film 107c and under the capacitor dielectric film 107d.

As a semiconductor integrated circuit increases in scale, the effective time period for applying voltage to the capacitor upper electrodes 108b and 108d may be longer than that for the gate electrodes 108a and 108c. As a result, the capacitor dielectric films 107b and 107d are required to be more reliable than the gate oxide films 107a and 107c. More specifically, when the MOS capacitors 106b and 106d are used as decoupling capacitors, the capacitor upper electrodes 108b and 108d receive DC voltage continuously applied thereto, requiring higher reliability of the capacitor dielectric films 107b and 107d.

Such requirement for reliability is not limited to the MOS capacitor. That is, in an MOSFET receiving high voltage applied to a gate electrode thereof, a gate insulating film is also required to have high reliability. Hence, comparing the MOSFETs in voltage level, the one receiving higher gate voltage should be improved more for increasing reliability of a gate insulating film thereof than another receiving lower gate voltage.

However, improvement for increasing reliability cannot be found in the prior-art first and second semiconductor devices. These first and second semiconductor devices each experience the problem of insufficient reliability of the capacitor dielectric films 107b and 107d.

SUMMARY OF THE INVENTION

It is therefore an object of the present invention to provide a semiconductor device and a method of manufacturing the same allowing improvement in reliability of an insulating film provided on a main surface of a substrate (a capacitor dielectric film of an MOS capacitor or a gate insulating film of an MOSFET).

According to a first aspect of the present invention, the semiconductor device includes an SOI substrate, a first MOSFET, a first impurity-injected region of a predetermined conductivity type, and a first MOS capacitor. The SOI substrate includes a support substrate, an insulating layer, and a semiconductor layer having a first concentration of the predetermined conductivity type stacked in this order. The first MOSFET is provided in a first element forming region of the SOI substrate, and includes a first gate insulating film provided on a main surface of the semiconductor layer. The first impurity-injected region is provided under the first gate insulating film, extending in the semiconductor layer from a certain depth from the main surface to a depth greater than the certain depth. The first MOS capacitor is provided in a second element forming region of the SOI substrate, and includes a first capacitor dielectric film provided on the main surface. The first impurity-injected region has a first impurity concentration distribution given by a second concentration higher than the first concentration. The semiconductor layer has a second impurity concentration distribution given by the first concentration under the first capacitor dielectric film. The first concentration creating the second impurity concentration distribution uniformly extends in a depth direction from at least a certain depth from the main surface to a contact surface between the semiconductor layer and the insulating layer.

When the first concentration is the initial impurity concentration of the semiconductor layer, the method of manufacturing the semiconductor device includes the following step. In this step, a photoresist is provided to cover the second element forming region and an impurity is implanted by ion implantation process into the lower part of the semiconductor layer using the photoresist as a mask against implantation, to form the first impurity-injected region in the semiconductor layer in the first element forming region. Therefore, this ion implantation causes no damage to the semiconductor layer in the second element forming region. As a result, it is allowed to improve reliability of the first capacitor dielectric film to be formed later on the main surface of the semiconductor layer in the second element forming region.

According to a second aspect of the present invention, the semiconductor device includes a semiconductor substrate having a first concentration of a predetermined conductivity type, an MOSFET, an impurity-injected region of the predetermined conductivity type, and an MOS capacitor. The MOSFET is provided in a first element forming region of the semiconductor substrate, and includes a gate insulating film provided on a first main surface of the semiconductor substrate. The impurity-injected region is provided under the gate insulating film, extending in the first main surface. The MOS capacitor is provided in a second element forming region of the semiconductor substrate, and includes a capacitor dielectric film provided on the first main surface. The impurity-injected region has a first impurity concentration distribution given by a second concentration higher than the first concentration. The semiconductor substrate has a second impurity concentration distribution given by the first concentration under the capacitor dielectric film. The first concentration creating the second impurity concentration distribution uniformly and entirely extending in a depth direction from the first main surface to a second main surface opposite to the first main surface.

When the first concentration is the initial impurity concentration of the semiconductor substrate, the method of manufacturing the semiconductor device includes the following step. In this step, a photoresist is provided to cover the second element forming region and an impurity is implanted by ion implantation process into the first main surface of the semiconductor substrate using the photoresist as a mask against implantation, to form the impurity-injected region in the semiconductor substrate in the first element forming region. Therefore, this ion implantation causes no damage to the semiconductor substrate in the second element forming region. As a result, it is allowed to improve reliability of the capacitor dielectric film to be formed later on the first main surface of the semiconductor substrate in the second element forming region.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a sectional view illustrating the structure of a semiconductor device according to a first preferred embodiment of the present invention;

FIGS. 3 through 6 are sectional views illustrating a method of manufacturing a semiconductor device according to the first preferred embodiment of the present invention following the sequence of the steps thereof;

FIGS. 14 through 18 are sectional views illustrating a method of manufacturing a semiconductor device according to the third preferred embodiment of the present invention following the sequence of the steps thereof;

DESCRIPTION OF THE PREFERRED EMBODIMENTS

First Preferred Embodiment

Figure 2A:
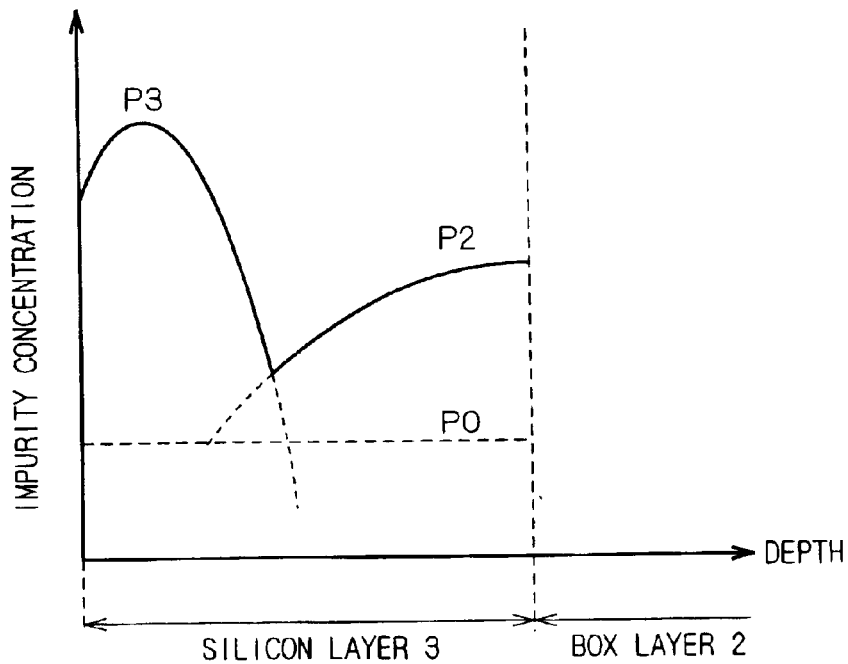
FIGS. 2A and 2B are graphs each showing an impurity profile in a silicon layer with respect to the first preferred embodiment of the present invention.

FIG. 1 is a sectional view illustrating the structure of a semiconductor device according to the first preferred embodiment of the present invention. The semiconductor device of the first preferred embodiment includes an SOI substrate 4, element isolation insulating films 5a through 5c of partial isolation type, an NMOSFET 6a, and an MOS capacitor 6b. The MOS capacitor 6b is usable as a decoupling capacitor, for example. The SOI substrate 4 includes a silicon substrate 1, a BOX layer 2, and a P-type silicon layer 3 stacked in this order. The silicon layer 3 has an impurity concentration P0 which is on the order of 1E15 $cm^{-3}$. The element isolation insulating films 5a through 5c are partially provided in the upper surface of the silicon layer 3. The element isolation insulating films 5a through 5c are of trench type or LOCOS type.

The NMOSFET 6a is provided in a first element forming region defined by the element isolation insulating films 5a and 5b. The NMOSFET 6a includes a gate oxide film 7a, a gate electrode 8a, and a pair of $N^+$-type source/drain regions 9a. The gate oxide film 7a is provided on the upper surface of the silicon layer 3. The gate electrode 8a is provided on the gate oxide film 7a. The source/drain regions 9a are provided in the silicon layer 3, holding a channel forming region defined under the gate oxide film 7a therebetween.

The MOS capacitor 6b is provided in a second element forming region defined by the element isolation insulating films 5b and 5c. The MOS capacitor 6b includes a capacitor dielectric film 7b provided on the upper surface of the silicon layer 3, and a capacitor upper electrode 8b on the capacitor dielectric film 7b. The capacitor dielectric film 7b is required to be more reliable than the gate oxide film 7a. Here, "reliability" required for an insulating film means a characteristic thereof that causes no dielectric breakdown of the insulating film even when stress is applied to the insulating film or when stress is accumulated therein. As the standards for judging reliability, MTBF (mean time between failures) and MTTF (mean time to failure) may be employed, for example.

The silicon layer 3 acts as a capacitor lower electrode of the MOS capacitor 6b in a region opposed to the capacitor upper electrode 8b, holding the capacitor dielectric film 7b therebetween. The MOS capacitor 6b further includes a pair of $P^+$-type contact regions 9b. The contact regions 9b are provided in the silicon layer 3, holding the region of the silicon layer 3 acting as a capacitor lower electrode therebetween.

By ion implantation process, a P-type impurity for element isolation is implanted into the silicon layer 3 defined between the bottom surface of the element isolation insulating film 5a and the upper surface of the BOX layer 2. The silicon layer 3 including this P-type impurity implanted therein has an impurity concentration P1 which is on the order of 1E17 $cm^{-3}$ to 2E18 $cm^{-3}$. By ion implantation process, a P-type impurity is further implanted at the impurity concentration P1 into the silicon layer 3 defined between the left half of the bottom surface of the element isolation insulating film 5b (namely, half of the bottom surface thereof on the side of the NMOSFET 6a) and the upper surface of the BOX layer 2.

Resulting from this implantation, a P-type impurity is implanted into the silicon layer 3 defined under the gate oxide film 7a and in the vicinity of an interface between the silicon layer 3 and the BOX layer 2. Under the capacitor dielectric film 7b and in the vicinity of an interface between the silicon layer 3 and the BOX layer 2, the silicon layer 3 has the impurity concentration P0 which is the initial concentration of itself.

By ion implantation process, a P-type impurity for controlling threshold voltage of the NMOSFET 6a is implanted into the upper surface of the silicon layer 3 defined under the gate oxide film 7a. That is, a P-type channel doping region is formed therein. The silicon layer 3 including this P-type impurity implanted therein has an impurity concentration P3 which is on the order of 1E16 $cm^{-3}$ to 1E18 $cm^{-3}$. Resulting from this implantation, a P-type impurity is implanted at the impurity concentration P3 into the upper surface of the silicon layer 3 defined under the capacitor dielectric film 7b.

Figure 2B:
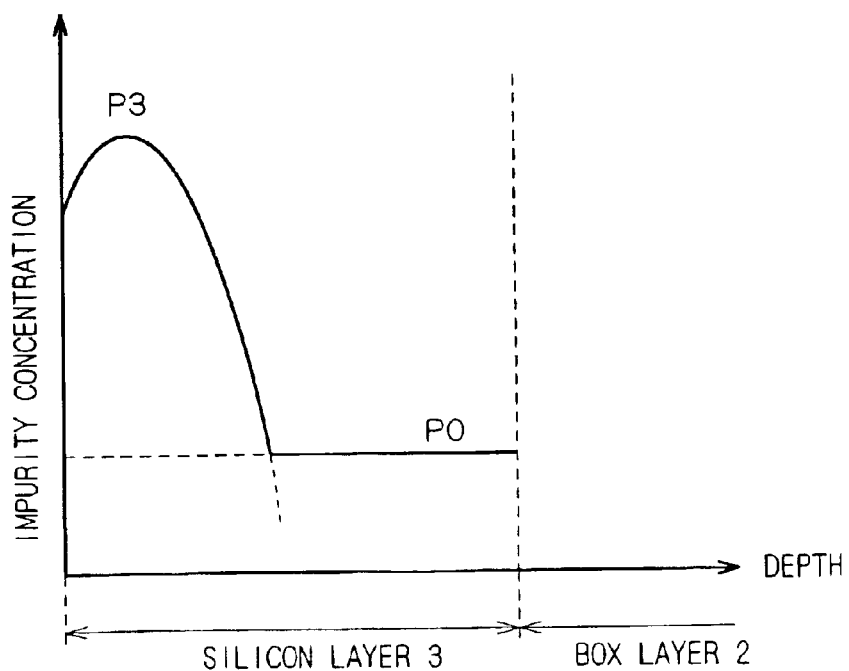

FIG. 2A is a graph showing an impurity profile in the silicon layer 3 under the gate oxide film 7a, and FIG. 2B is a graph showing an impurity profile in the silicon layer 3 under the capacitor dielectric film 7b. As seen from FIGS. 2A and 2B, in the semiconductor device of the first preferred embodiment, the silicon layer 3 has different impurity profiles under the gate oxide film 7a and under the capacitor dielectric film 7b. As seen from FIG. 2A, the impurity profile in the silicon layer 3 under the gate oxide film 7a is given by the impurity concentrations P2 and P3 each higher than the concentration P0. As seen from FIG. 2B, the impurity profile in the silicon layer 3 under the capacitor dielectric film 7b is partially given by the impurity concentration P0 uniformly extending from a certain depth from the upper surface of the silicon layer 3 (from a zero depth) to a contact surface between the silicon layer 3 and the BOX layer 2.

Figure 3:
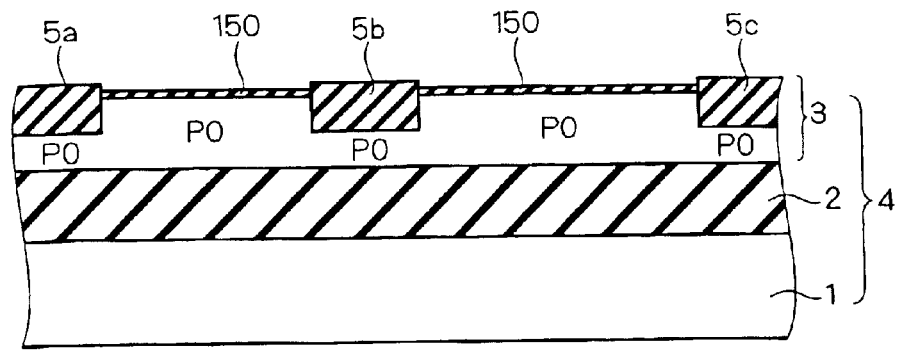

FIGS. 3 through 6 are sectional views illustrating a method of manufacturing a semiconductor device according to the first preferred embodiment following the sequence of the steps thereof. With reference to FIG. 3, the SOI substrate 4 is prepared first. Next, using the well-known trench isolation or LOCOS isolation technique, the element isolation insulating films 5a through 5c are provided in the upper surface of the silicon layer 3. As illustrated in FIG. 3, a silicon oxide film 150 remains on the upper surface of the silicon layer 3. In the step of providing the element isolation insulating films 5a through 5c, the silicon oxide film 150 serves as an underlying layer of a silicon nitride film.

Figure 4:
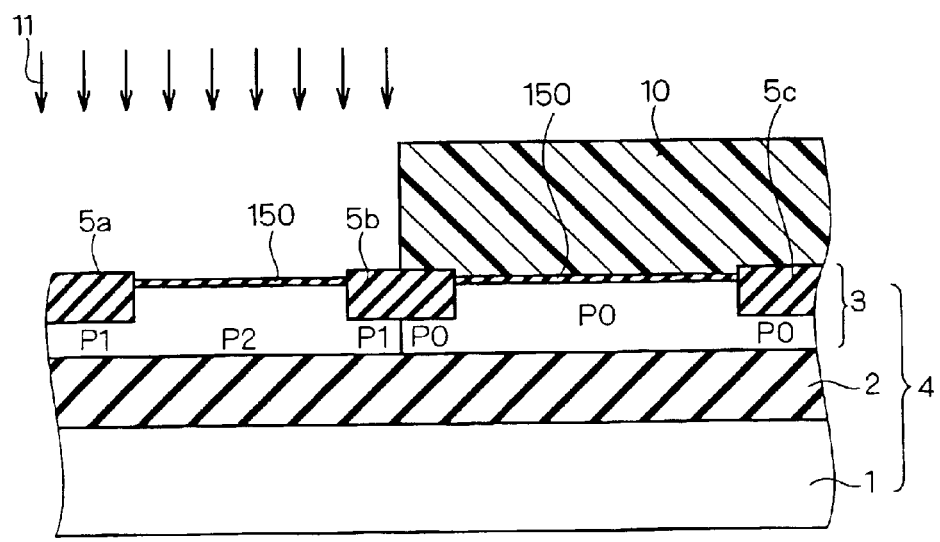

With reference to FIG. 4, a photoresist 10 is thereafter provided by photolithography to cover the second element forming region. In FIG. 4, the right half of the upper surface of the element isolation insulating film 5b and the upper surface of the element isolation insulating film 5c are covered with the photoresist 10. Thereafter using the photoresist 10 as a mask against implantation, a P-type impurity 11 is implanted by ion implantation process into the silicon layer 3 to a great depth, at a relatively high energy level allowing the impurity 11 to reach an interface between the silicon layer 3 and the BOX layer 2. The P-type impurity 11 is implanted into the silicon layer 3 through the element isolation insulating films 5a, 5b and the silicon oxide film 150 in the first element forming region. As a result, impurity-implanted regions having the impurity concentrations P1 and P2 are formed in the silicon layer 3. After this, the photoresist 10 is removed.

With reference to FIG. 5, a P-type impurity 12 is thereafter implanted by ion implantation process into the upper surface of the silicon layer 3 to a shallow depth at a relatively low energy level. The P-type impurity 12 is implanted into the silicon layer 3 through the silicon oxide film 150 in the first and second element forming regions. As a result, an impurity-implanted region having the impurity concentration P3 is formed in the upper surface of the silicon layer 3 including no element isolation insulating films 5a through 5c. Thereafter the silicon oxide film 150 is removed by wet etching process using hydrofluoric acid.

With reference to FIG. 6, in the first and second element forming regions, a silicon oxide film is subsequently provided by thermal oxidation process on the upper surface of the silicon layer 3, growing to a thickness of about 3.5 nm. Next, following CVD process, a polysilicon film is entirely deposited thereon, which is then patterned by photolithography and anisotropic dry etching processes, to form the gate electrode 8a and the capacitor upper electrode 8b. The gate oxide film 7a is provided under the gate electrode 8a, and the capacitor dielectric film 7b is provided under the capacitor upper electrode 8b. The gate oxide film 7a is arranged on the upper surface of the silicon layer 3 defined in the first element forming region, and the capacitor dielectric film 7b is arranged on the upper surface of the silicon layer 3 in the second element forming region.

Thereafter, an N-type impurity is partially implanted into the silicon layer 3 by photolithography and ion implantation processes, to form the source/drain regions 9a. Resulting from this implantation, the N-type impurity is further implanted into the gate electrode 8a. Further, a P-type impurity is partially implanted into the silicon layer 3 by photolithography and ion implantation processes, to form the contact regions 9b. Resulting from this implantation, the P-type impurity is further implanted into the capacitor upper electrode 8b. The resultant structure thereby obtained is as given in FIG. 1.

Figure 7:
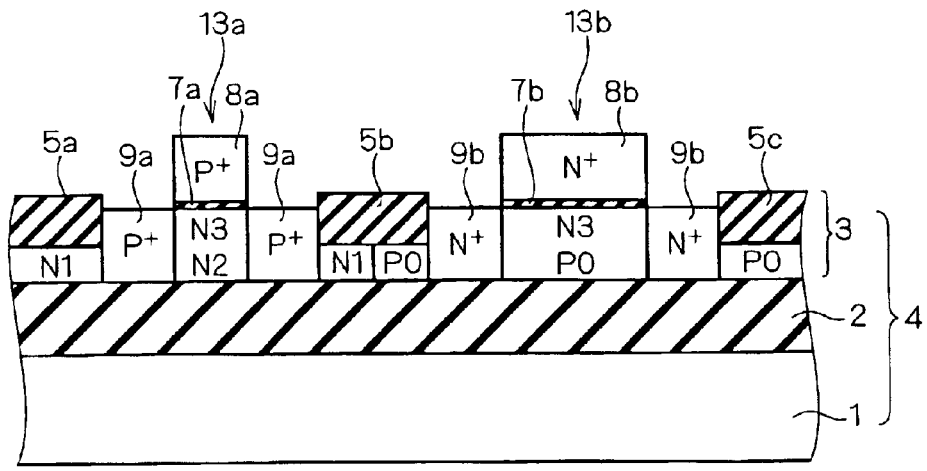
FIG. 7 is a sectional view illustrating a modification of the semiconductor device according to the first preferred embodiment of the present invention.

FIG. 7 is a sectional view illustrating a modification of the semiconductor device according to the first preferred embodiment. In the description given so far, the semiconductor device is shown to have the NMOSFET 6a. As illustrated in FIG. 7, a PMOSFET 13a may be alternatively provided. As seen from FIG. 7, in the PMOSFET 13a, the source/drain regions 9a are of P$^+$-type and the gate electrode 8a is of P$^+$-type.

In the description given so far, the semiconductor device is shown to have the MOS capacitor 6b including the P$^+$-type contact regions 9b. As illustrated in FIG. 7, an MOS capacitor 13b may be alternatively provided including the N$^+$-type contact regions 9b. The upper electrode 8b of the MOS capacitor 13b is of N$^+$-type.

In contrast to the semiconductor device illustrated in FIG. 1 including the impurity-implanted regions having the impurity concentrations P1, P2 and P3, the semiconductor device in FIG. 7 includes impurity-implanted regions having impurity concentrations N1, N2 and N3, respectively.

As described, in the semiconductor device and the method of manufacturing the same according to the first preferred embodiment, the photoresist 10 is provided to cover the second element forming region and thereafter, the P-type impurity 11 is implanted by ion implantation process into the silicon layer 3 using the photoresist 10 as a mask against implantation as illustrated in FIG. 4. The P-type impurity 11 is implanted at a relatively high energy level as mentioned, thus heavily damaging the silicon layer 3. The damage to the silicon layer 3 resulting from the ion implantation of the P-type impurity 11 will be the cause of deterioration in reliability of the insulating film to be provided later on the upper surface of the silicon layer 3. In contrast, according to the method of the first preferred embodiment, the photoresist 10 covering the second element forming region is previously provided to be used in the ion implantation process of the P-type impurity 11. Therefore, ion implantation of the P-type impurity 11 causes no damage to the silicon layer 3 in the second element forming region. As a result, reliability of the capacitor dielectric film 7b, to be provided later on the upper surface of the silicon layer 3 in the second element forming region, can be improved.

Second Preferred Embodiment

Figure 8:
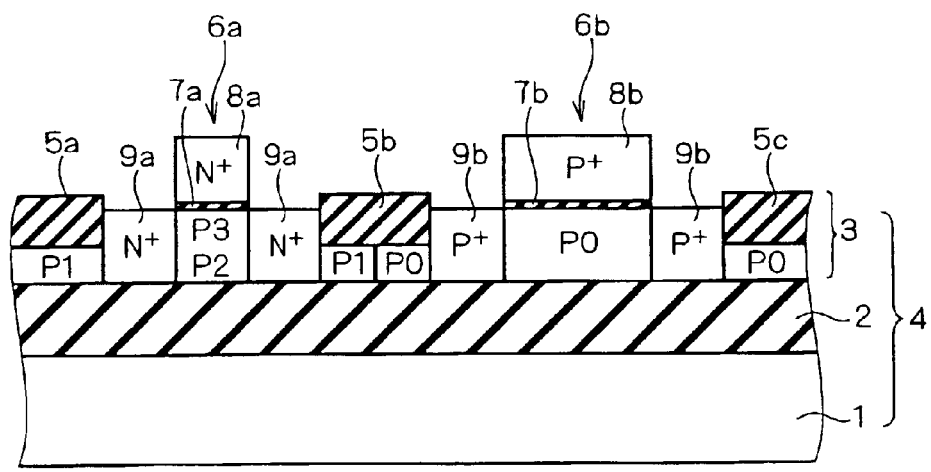
FIG. 8 is a sectional view illustrating the structure of a semiconductor device according to a second preferred embodiment of the present invention.
Figure 9A:
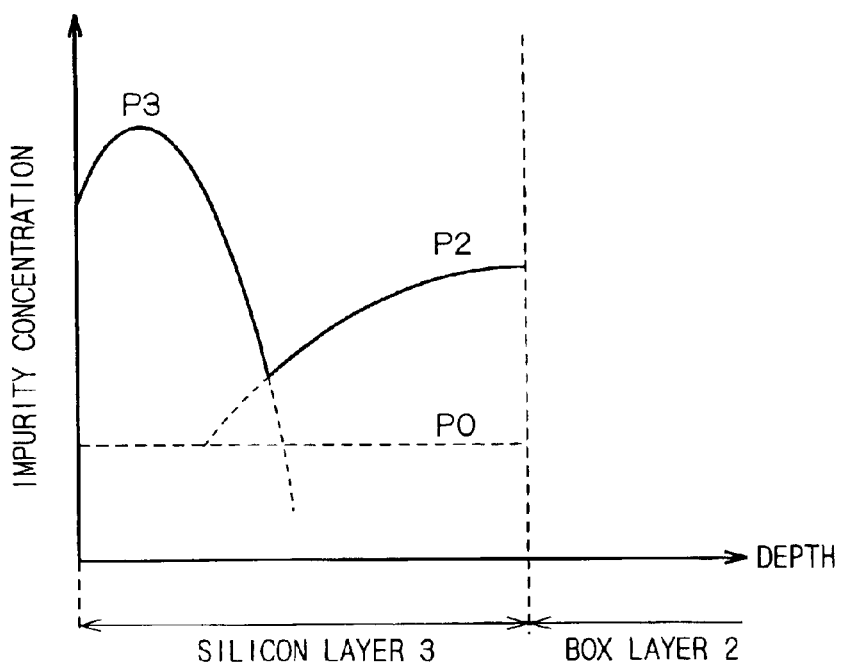
FIGS. 9A and 9B are graphs each showing an impurity profile in a silicon layer with respect to the second preferred embodiment of the present invention.
Figure 9B:
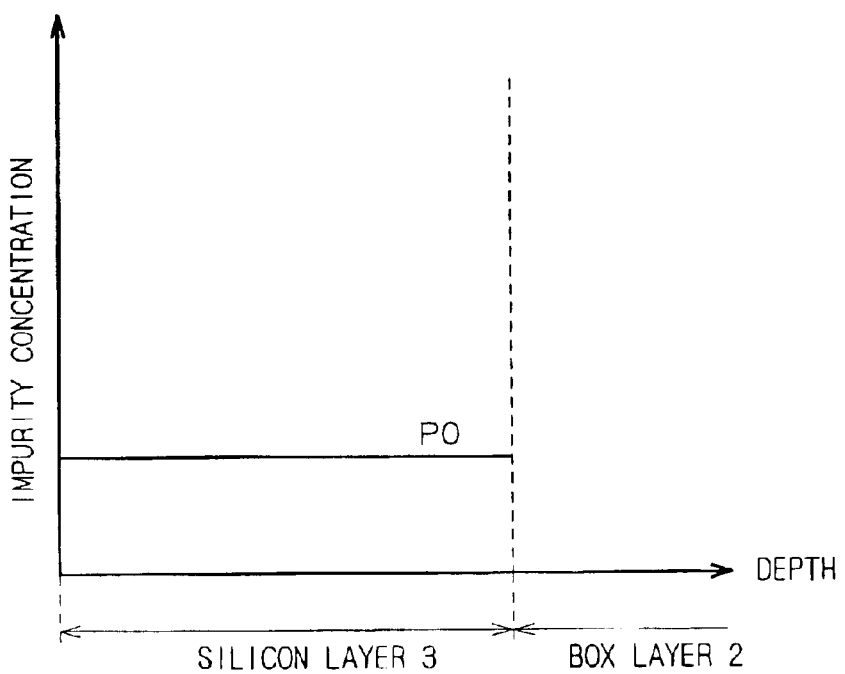

FIG. 8 is a sectional view illustrating the structure of a semiconductor device according to the second preferred embodiment of the present invention. FIG. 9A is a graph showing an impurity profile in the silicon layer 3 under the gate oxide film 7a, and FIG. 9B is a graph showing an impurity profile in the silicon layer 3 under the capacitor dielectric film 7b. As illustrated in FIG. 8, in the upper surface of the silicon layer 3, there is no impurity-implanted region having the impurity concentration P3 under the capacitor dielectric film 7b. As seen from FIG. 9B, at all depths from the upper surface to the bottom surface of the silicon layer 3, the impurity concentration in the silicon layer 3 under the capacitor dielectric film 7b is thus the concentration P0 which is the initial concentration of the silicon layer 3. The structure of the semiconductor device of the second preferred embodiment is the same in the other respects as that of the semiconductor device of the first preferred embodiment given in FIG. 1.

Figure 10:
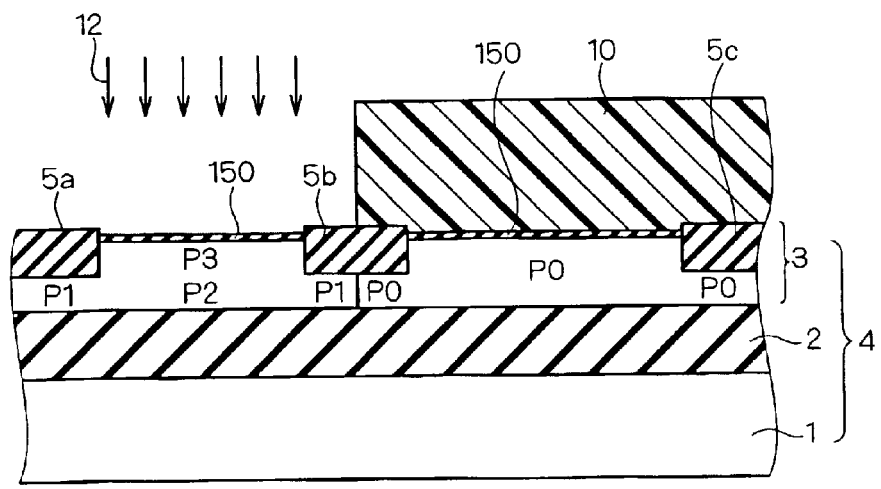
FIG. 10 is a sectional view illustrating one step of a method of manufacturing a semiconductor device according to the second preferred embodiment of the present invention.

FIG. 10 is a sectional view illustrating one step of a method of manufacturing a semiconductor device according to the second preferred embodiment. In the method of the first preferred embodiment as described, after the photoresist 10 in FIG. 4 is removed, the P-type impurity 12 is implanted by ion implantation in the step shown in FIG. 5. In contrast, according to the method of the second preferred embodiment, the P-type impurity 12 is implanted by ion implantation process prior to the removal of the photoresist 10 as seen from FIG. 10. That is, the P-type impurity 12 is implanted by ion implantation process into the upper surface of the silicon layer 3 using the photoresist 10 as a mask against implantation.

Figure 11:
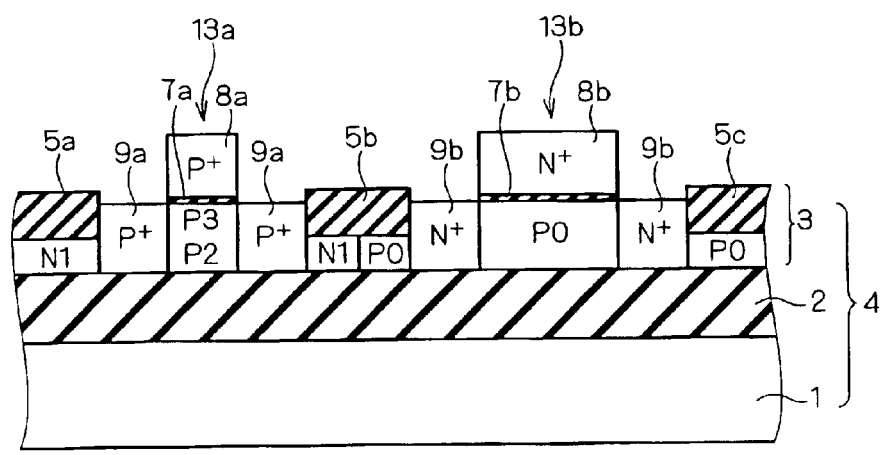
FIG. 11 is a sectional view illustrating a modification of the semiconductor device according to the second preferred embodiment of the present invention.

FIG. 11 is a sectional view illustrating a modification of the semiconductor device according to the second preferred embodiment. As seen from FIG. 11, the semiconductor device may include the PMOSFET 13a instead of the NMOSFET 6a, and include the MOS capacitor 13b instead of the MOS capacitor 6b. In the MOS capacitor 6b in FIGS. 1 and 8, the upper electrode (capacitor upper electrode 8b) and the lower electrode (silicon layer 3) are shown to have the same conductivity (P-type conductivity). In contrast, in the MOS capacitor 13b in FIG. 11, the upper and lower electrodes are shown to have different conductivities, namely, the former being the N-type conductivity and the latter being the P-type conductivity.

As described, in the semiconductor device and the method of manufacturing the same according to the second preferred embodiment, damage to the silicon layer 3 in the second element forming region caused by the ion implantation of the P-type impurity 12 as well as damage to the silicon layer 3 in the second element forming region by the ion implantation of the P-type impurity 11 can be avoided. As a result, as compared with the first preferred embodiment, reliability of the capacitor dielectric film 7b can be improved to a greater degree.

Third Preferred Embodiment

Figure 12:
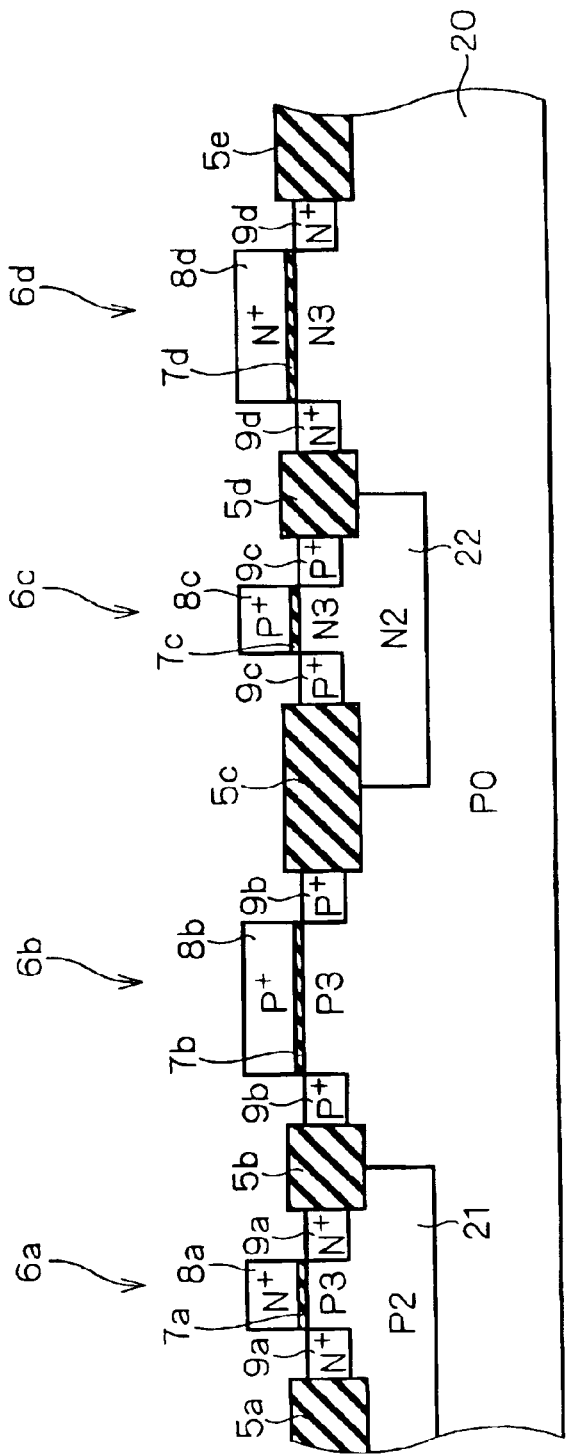
FIG. 12 is a sectional view illustrating the structure of a semiconductor device according to a third preferred embodiment of the present invention.

FIG. 12 is a sectional view illustrating the structure of a semiconductor device according to the third preferred embodiment of the present invention. The semiconductor device of the third preferred embodiment includes a P-type silicon substrate 20 having the impurity concentration P0, element isolation insulating films 5a through 5e, the NMOS-FET 6a, a PMOSFET 6c, and MOS capacitors 6b and 6d. The silicon substrate 20 is a substrate other than an SOI substrate, also referred to as "a bulk substrate". The NMOS-FET 6a is provided in a first element forming region defined by the element isolation insulating films 5a and 5b. The MOS capacitor 6b is provided in a second element forming region defined by the element isolation insulating films 5b and 5c. The PMOSFET 6c is provided in a third element forming region defined by the element isolation insulating films 5c and 5d. Further, the MOS capacitor 6d is provided in a fourth element forming region defined by the element isolation insulating films 5d and 5e.

In the first element forming region, a P-type well 21 having the impurity concentration P2 is provided in the upper surface of the silicon substrate 20. The source/drain regions 9a of the NMOSFET 6a are provided in the P-type well 21. In the third element forming region, an N-type well 22 having the impurity concentration N2 is provided in the upper surface of the silicon substrate 20. Source/drain regions 9c of the PMOSFET 6c are provided in the N-type well 22. In the second and fourth element forming regions, the silicon substrate 20 includes no P-type well 21 or N-type well 22 therein.

Figure 13A:
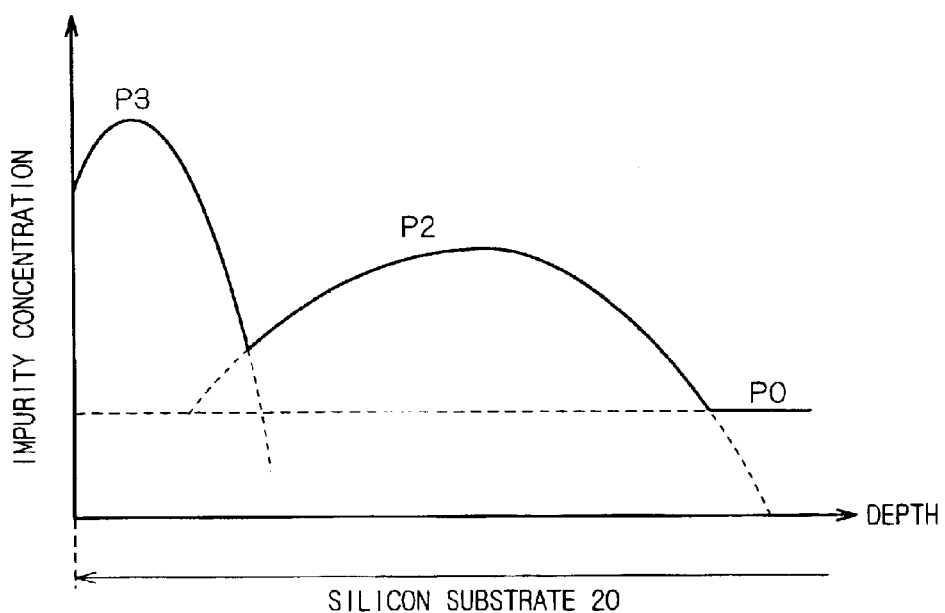
FIGS. 13A and 13B are graphs each showing an impurity profile in a silicon substrate with respect to the third preferred embodiment of the present invention.
Figure 13B:
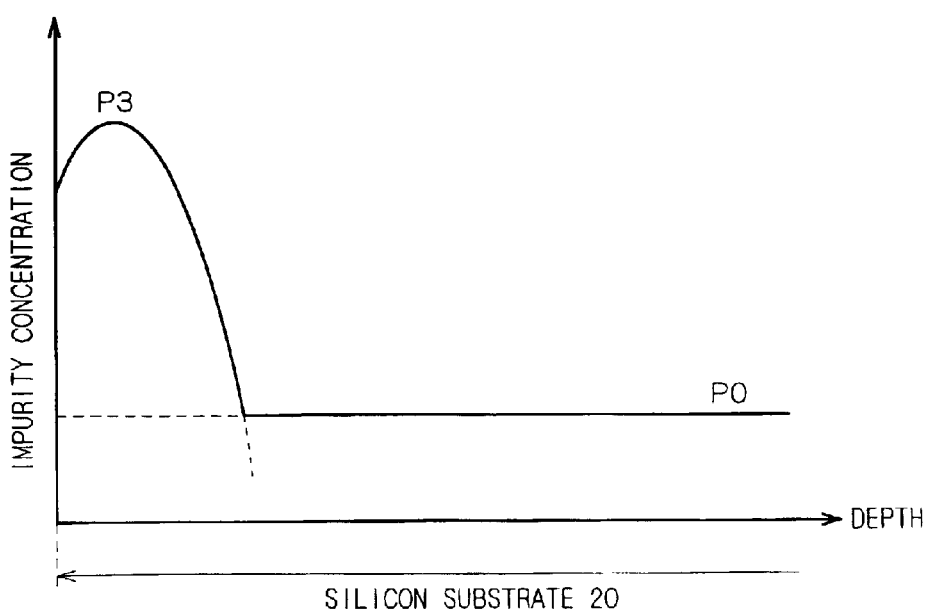

FIG. 13A is a graph showing an impurity profile in the silicon substrate 20 under the gate oxide film 7a, and FIG. 13B is a graph showing an impurity profile in the silicon substrate 20 under the capacitor dielectric film 7b. As seen from FIGS. 13A and 13B, in the semiconductor device of the third preferred embodiment, the silicon substrate 20 has different impurity profiles in the region under the gate oxide film 7a and in the region under the capacitor dielectric film 7b. As seen from FIG. 13A, the impurity profile in the silicon substrate 20 under the gate oxide film 7a is given by the impurity concentrations P2 and P3 each higher than the concentration P0. As seen from FIG. 13B, the impurity profile in the silicon substrate 20 under the capacitor dielectric film 7b is partially given by the concentration P0 uniformly extending from a certain depth from the upper surface of the silicon substrate 20 (from a zero depth) to the bottom surface of the silicon substrate 20.

FIGS. 14 through 18 are sectional views illustrating a method of manufacturing a semiconductor device according to the third preferred embodiment following the sequence of the steps thereof. With reference to FIG. 14, the silicon substrate 20 is prepared first. Next, the element isolation insulating films 5a through 5e are provided in the upper surface of the silicon substrate 20. As illustrated in FIG. 14, the silicon oxide film 150 remains on the upper surface of the silicon substrate 20. In the step of providing the element isolation insulating films 5a through 5e, the silicon oxide film 150 serves as an underlying layer of a silicon nitride film.

With reference to FIG. 15, a photoresist 23 is provided next by photolithography to cover the second, third, and fourth element forming regions. Thereafter using the photoresist 23 as a mask against implantation, a P-type impurity 24 is implanted by ion implantation process into the silicon substrate 20 at a relatively high energy level. As a result, in the first element forming region, the P-type well 21 having the impurity concentration P2 is formed in the upper surface of the silicon substrate 20, reaching a relatively great depth. Thereafter the photoresist 23 is removed.

Figure 16:
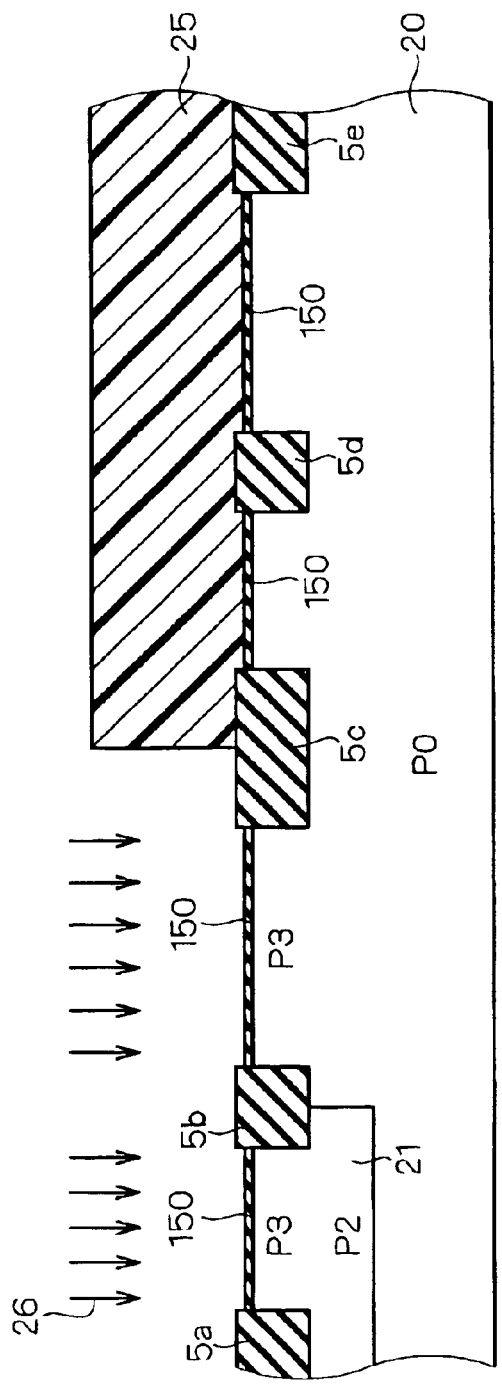

With reference to FIG. 16, a photoresist 25 is provided next by photolithography to cover the third and fourth element forming regions. Thereafter using the photoresist 25 as a mask against implantation, a P-type impurity 26 for controlling threshold voltage of the NMOSFET 6a is implanted by ion implantation process into the silicon substrate 20 at a relatively low energy level. As a result, in the first and second element forming regions, an impurity-implanted region having the impurity concentration P3 is formed in the upper surface of the silicon substrate 20, reaching a relatively shallow depth. Thereafter the photoresist 25 is removed.

Figure 17:
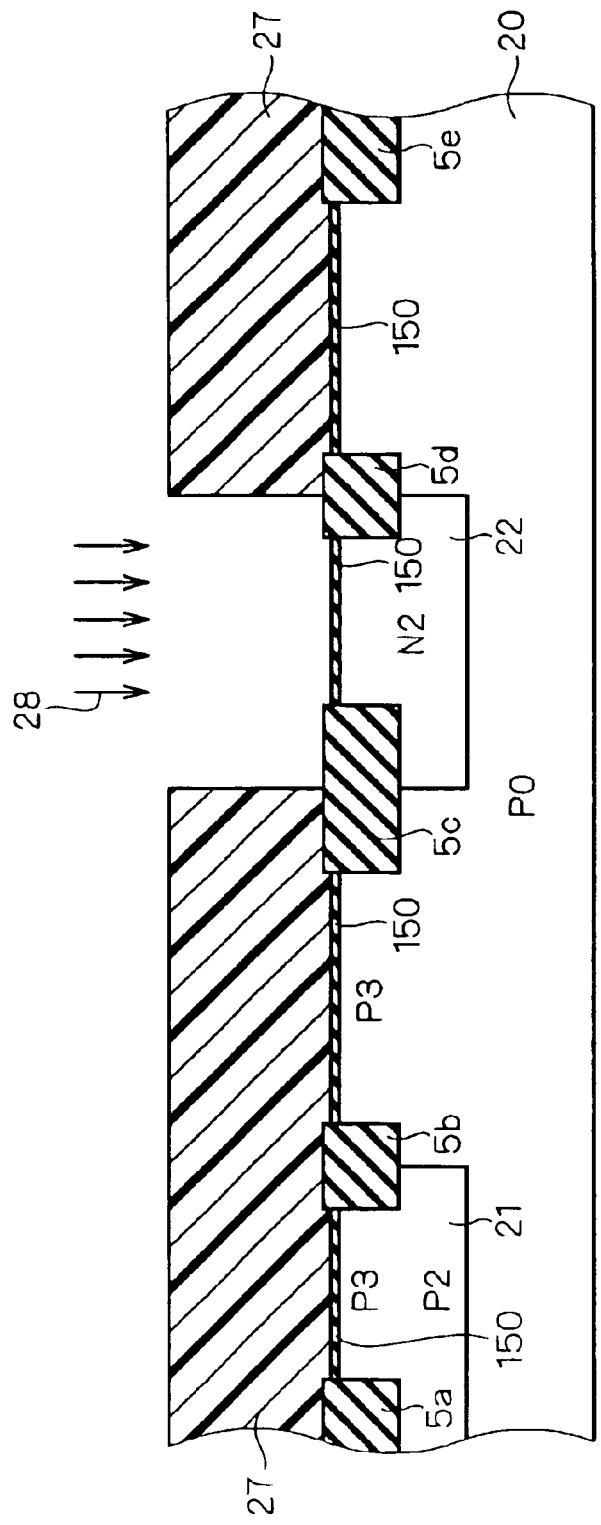

With reference to FIG. 17, a photoresist 27 is provided next by photolithography to cover the first, second and fourth element forming regions. Thereafter using the photoresist 27 as a mask against implantation, an N-type impurity 28 is implanted into the silicon substrate 20 at a relatively high energy level. As a result, in the third element forming region, the N-type well 22 having the impurity concentration N2 is formed in the upper surface of the silicon substrate 20, reaching a relatively great depth. Thereafter the photoresist 27 is removed.

Figure 18:
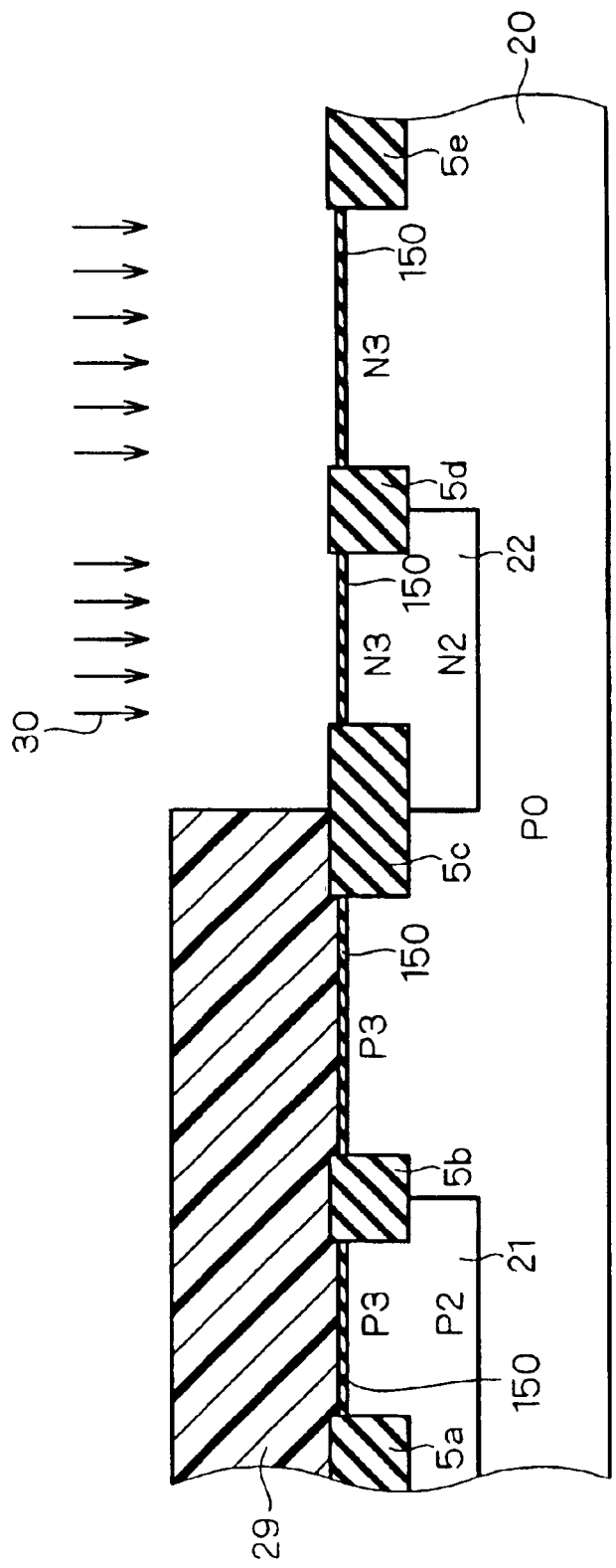

With reference to FIG. 18, a photoresist 29 is provided next by photolithography to cover the first and second element forming regions. Thereafter using the photoresist 29 as a mask against implantation, an N-type impurity 30 for controlling threshold voltage of the PMOSFET 6c is implanted by ion implantation process into the silicon substrate 20 at a relatively low energy level. As a result, in the third and fourth element forming regions, an impurity-implanted region having the impurity concentration N3 is formed in the upper surface of the silicon substrate 20, reaching a relatively shallow depth. Thereafter the photoresist 29 is removed.

Subsequent to this, as in the method of the first preferred embodiment, the step of removing the silicon oxide film 150, the steps of forming the gate oxide films 7a, 7c, the capacitor dielectric films 7b, 7d, the gate electrodes 8a, 8c and the capacitor upper electrodes 8b, 8d, and the steps of forming the source/drain regions 9a, 9c and the contact regions 9b, 9d are followed in this order. The resultant structure thereby obtained is as given in FIG. 12.

As described, in the semiconductor device and the method of manufacturing the same according to the third preferred embodiment, the photoresist 23 is provided to cover the at least second and fourth element forming regions, which is then used as a mask against implantation for implanting the P-type impurity 24 into the silicon substrate 20 as shown in FIG. 15. Further, the photoresist 27 is provided to cover the at least second and fourth element forming regions, which is then used as a mask against implantation for implanting the N-type impurity 28 into the silicon substrate 20 as shown in FIG. 17. Therefore, in the second and fourth element forming regions, ion implantation of the P-type impurity 24 and the N-type impurity 28 causes no damage to the silicon substrate 20. As a result, reliability of the capacitor dielectric films 7b and 7d can be improved.

Fourth Preferred Embodiment

Figure 19:
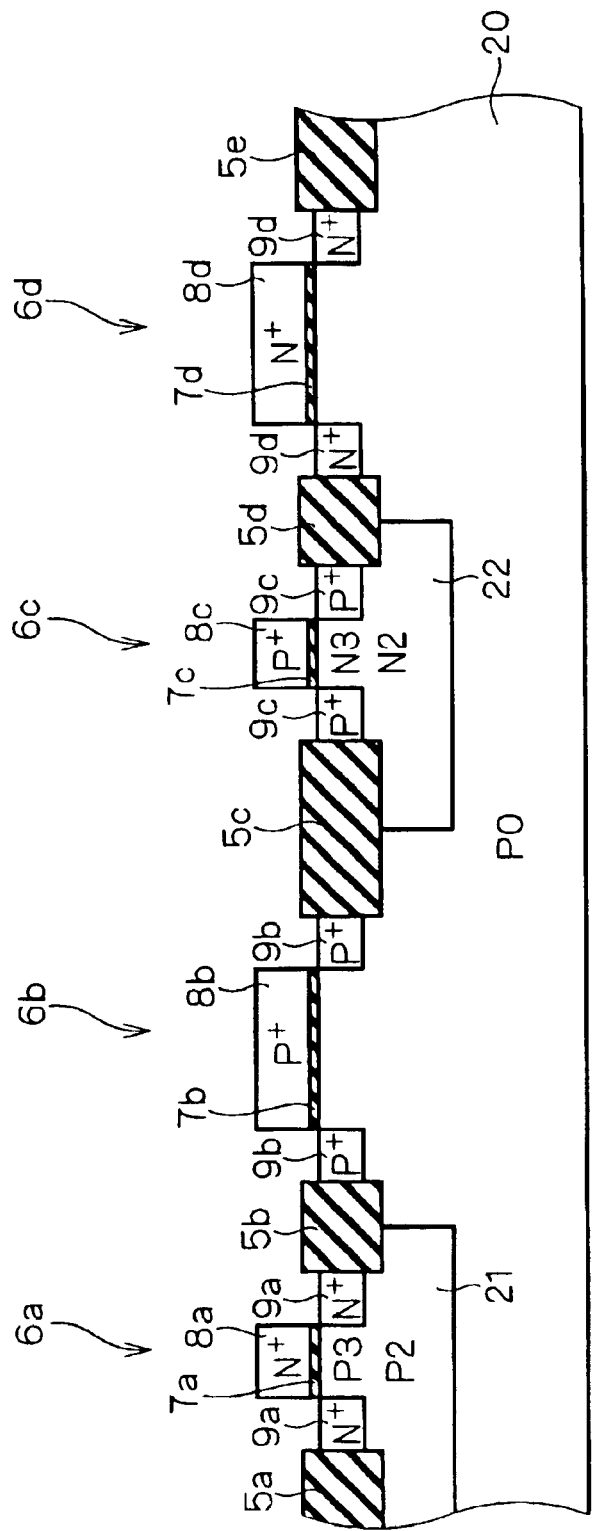
FIG. 19 is a sectional view illustrating the structure of a semiconductor device according to a fourth preferred embodiment of the present invention.
Figure 20A:
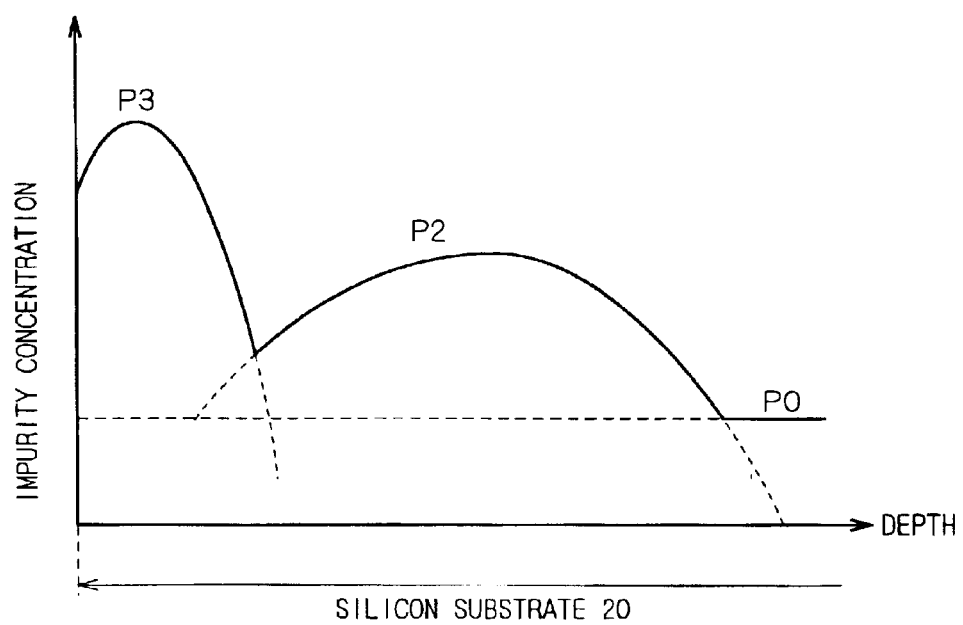
FIGS. 20A and 20B are graphs each showing an impurity profile in a silicon substrate with respect to the fourth preferred embodiment of the present invention.
Figure 20B:
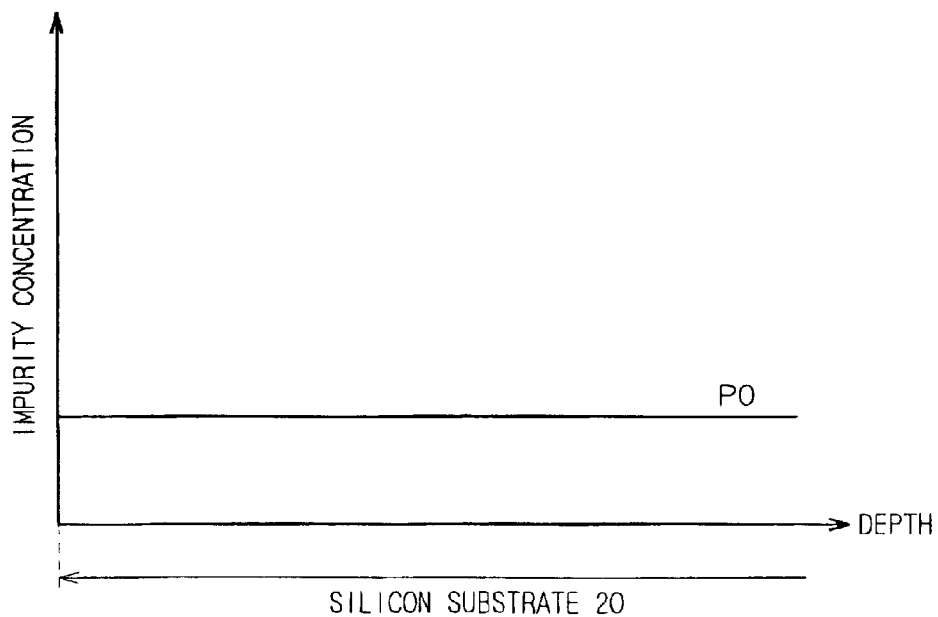

FIG. 19 is a sectional view illustrating the structure of a semiconductor device according to the fourth preferred embodiment of the present invention. FIG. 20A is a graph showing an impurity profile in the silicon substrate 20 under the gate oxide film 7a, and FIG. 20B is a graph showing an impurity profile in the silicon substrate 20 under the capacitor dielectric film 7b. As illustrated in FIG. 19, in the upper surface of the silicon substrate 20, there is no impurity-implanted region having the impurity concentration P3 under the capacitor dielectric film 7b. In the upper surface of the silicon substrate 20, further, there is no impurity-implanted region having the impurity concentration N3 under the capacitor dielectric film 7d. As a result, at all depths from the upper surface to the bottom surface of the silicon substrate 20, the impurity concentration in the silicon substrate 20 under the capacitor dielectric films 7b and 7d is thus the concentration P0 which is the initial concentration of the silicon substrate 20. The structure of the semiconductor device of the fourth preferred embodiment is the same in the other respects as that of the semiconductor device of the third preferred embodiment given in FIG. 12.

Figure 21:
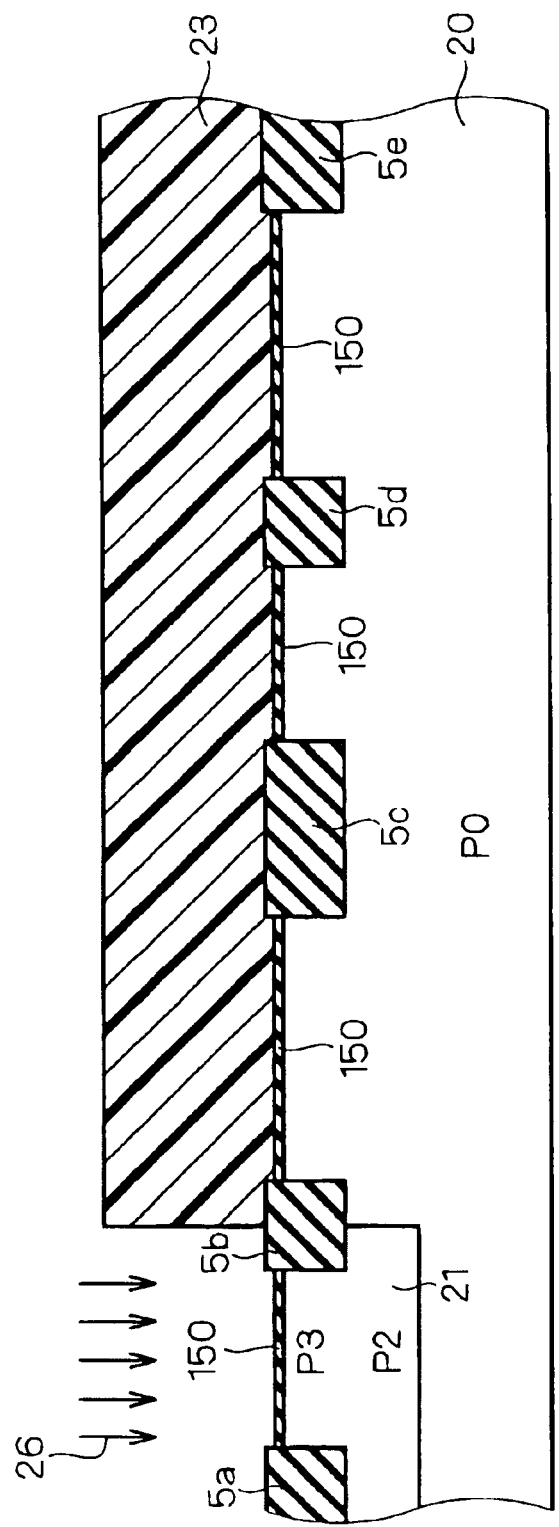
FIGS. 21 and 22 are sectional views illustrating a method of manufacturing a semiconductor device according to the fourth preferred embodiment of the present invention following the sequence of the steps thereof.
Figure 22:
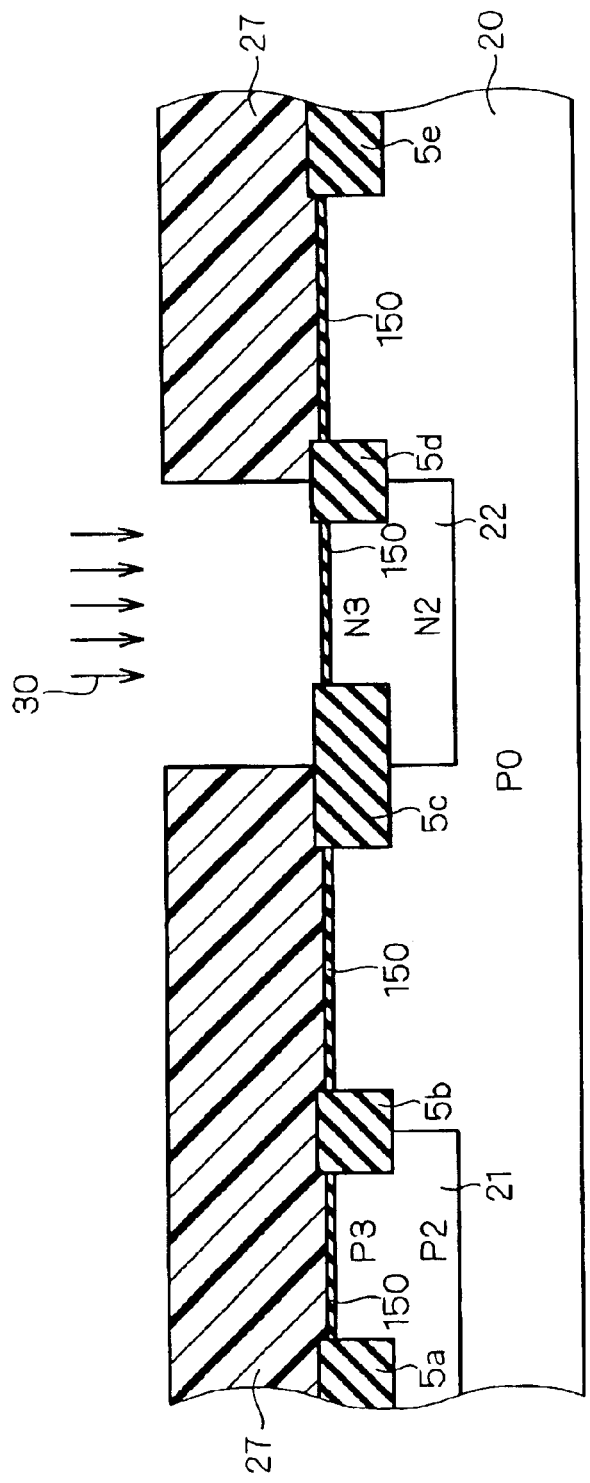

FIGS. 21 and 22 are sectional views illustrating a method of manufacturing a semiconductor device according to the fourth preferred embodiment following the sequence of the steps thereof. In the method of the third preferred embodiment, after the removal of the photoresist 23 illustrated in FIG. 15, the photoresist 25 is provided in the step shown in FIG. 16. The P-type impurity 26 is thereafter implanted by ion implantation process. In contrast, in the method of the fourth preferred embodiment, the P-type impurity 26 is implanted by ion implantation process prior to the removal of the photoresist 23 as illustrated in FIG. 21. That is, without providing the photoresist 25, the P-type impurity 26 is implanted by ion implantation into the upper surface of the silicon substrate 20 using the photoresist 23 as a mask against implantation.

In the method of the third preferred embodiment, further, after the removal of the photoresist 27 illustrated in FIG. 17, the photoresist 29 is provided in the step shown in FIG. 18. The N-type impurity 30 is thereafter implanted by ion implantation. In contrast, in the method of the fourth preferred embodiment, the N-type impurity 30 is implanted by ion implantation process prior to the removal of the photoresist 27 as illustrated in FIG. 22. That is, without providing the photoresist 29, the N-type impurity 30 is implanted by ion implantation into the upper surface of the silicon substrate 20 using the photoresist 27 as a mask against implantation.

As described, in the semiconductor device and the method of manufacturing the same according to the fourth preferred embodiment, damage to the silicon substrate 20 in the second and fourth element forming regions caused by the ion implantation of the P-type impurity 26 and the N-type impurity 30 as well as damage to the silicon substrate 20 in the second and fourth element forming regions caused by the ion implantation of the P-type impurity 24 and the N-type impurity 28 can be avoided. As a result, as compared with the third preferred embodiment, reliability of the capacitor dielectric films 7b and 7d can be improved to a greater degree.

Fifth Preferred Embodiment

Figure 23:
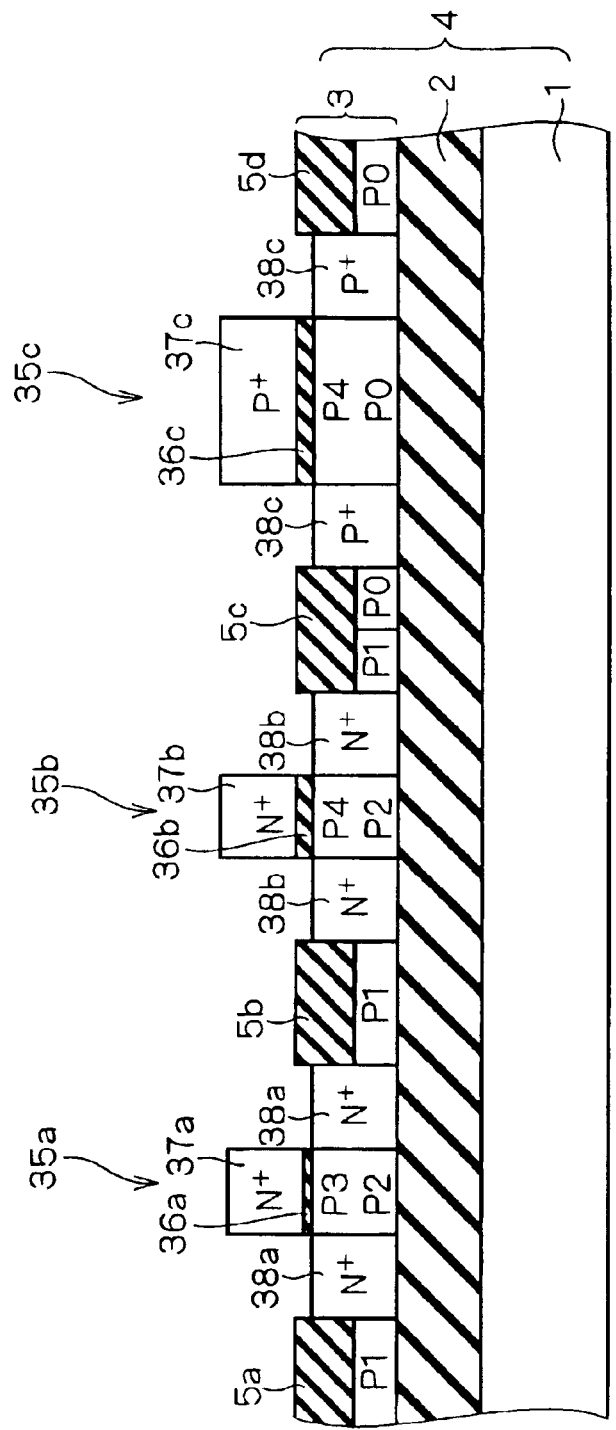
FIG. 23 is a sectional view illustrating the structure of a semiconductor device according to a fifth preferred embodiment of the present invention.

FIG. 23 is a sectional view illustrating the structure of a semiconductor device according to the fifth preferred embodiment of the present invention. The semiconductor device of the fifth preferred embodiment includes the SOI substrate 4, the element isolation insulating films 5a through 5d of partial isolation type, NMOSFETs 35a and 35b, and an MOS capacitor 35c. The NMOSFET 35a is provided in a first element forming region defined by the element isolation insulating films 5a and 5b. The NMOSFET 35a forms a low voltage circuit driven by a relatively low voltage. The NMOSFET includes a gate oxide film 36a having a thickness of about 3.5 nm, and a gate electrode 37a receiving a gate voltage of about 1.8 V applied thereto. Further, the NMOSFET 35a includes a pair of source/drain regions 38a.

The NMOSFET 35b is provided in a second element forming region defined by the element isolation insulating films 5b and 5c. The NMOSFET 35b forms a high voltage circuit driven by a relatively high voltage. The NMOSFET 35b includes a gate oxide film 36b required to be more reliable than the gate oxide film 36a. The gate oxide film 36b has a thickness of about 7.5 nm, which is larger than the thickness of the gate oxide film 36a. The NMOSFET 35b includes a gate electrode 37b receiving a gate voltage of about 3.3V applied thereto, which is higher than that applied to the gate electrode 37a. Further, the NMOSFET 35b includes a pair of source/drain regions 38b.

The MOS capacitor 35c is provided in a third element forming region defined by the element isolation insulating films 5c and 5d. The MOS capacitor 35c includes a capacitor dielectric film 36c and a capacitor upper electrode 37c. The capacitor dielectric film 36c is required to be more reliable than the gate oxide film 36a. The thickness of the capacitor dielectric film 36c is the same as that of the gate oxide film 36b. Alternatively, the capacitor dielectric film 36c may be greater in thickness than the gate oxide film 36b. In this case, three insulating films having their respective thicknesses are to be provided on the upper surface of the silicon layer 3. Further, the MOS capacitor 35c includes a pair of contact regions 38c.

By ion implantation process, a P-type impurity is implanted at the impurity concentration P1 into the silicon layer 3 defined between each bottom surface of the element isolation insulating films 5a, 5b and the upper surface of the BOX layer 2. By ion implantation process, a P-type impurity is further implanted at the impurity concentration P1 into the silicon layer 3 defined between the left half of the bottom surface of the element isolation insulating film 5c (namely, half of the bottom surface thereof on the side of the NMOSFET 35b) and the upper surface of the BOX layer 2. Resulting from this implantation, a P-type impurity is implanted at the impurity concentration P2 into the silicon layer 3 defined under the gate oxide films 36a and 36b, and in the vicinity of an interface between the silicon layer 3 and the BOX layer 2. Under the capacitor dielectric film 36c and in the vicinity of an interface between the silicon layer 3 and the BOX layer 2, the silicon layer 3 has the impurity concentration P0 which is the initial concentration of itself.

By ion implantation process, a P-type impurity for controlling threshold voltage of the NMOSFET 35a is implanted at the impurity concentration P3 into the upper surface of the silicon layer 3 defined under the gate oxide film 36a.

By ion implantation process, a P-type impurity for controlling threshold voltage of the NMOSFET 35b is implanted at an impurity concentration P4 into the upper surface of the silicon layer 3 defined under the gate oxide film 36b. The impurity concentration P4 is lower than the concentration P3. Resulting from this implantation, a P-type impurity is implanted at the impurity concentration P4 into the upper surface of the silicon layer 3 defined under the capacitor dielectric film 36c.

Figure 24:
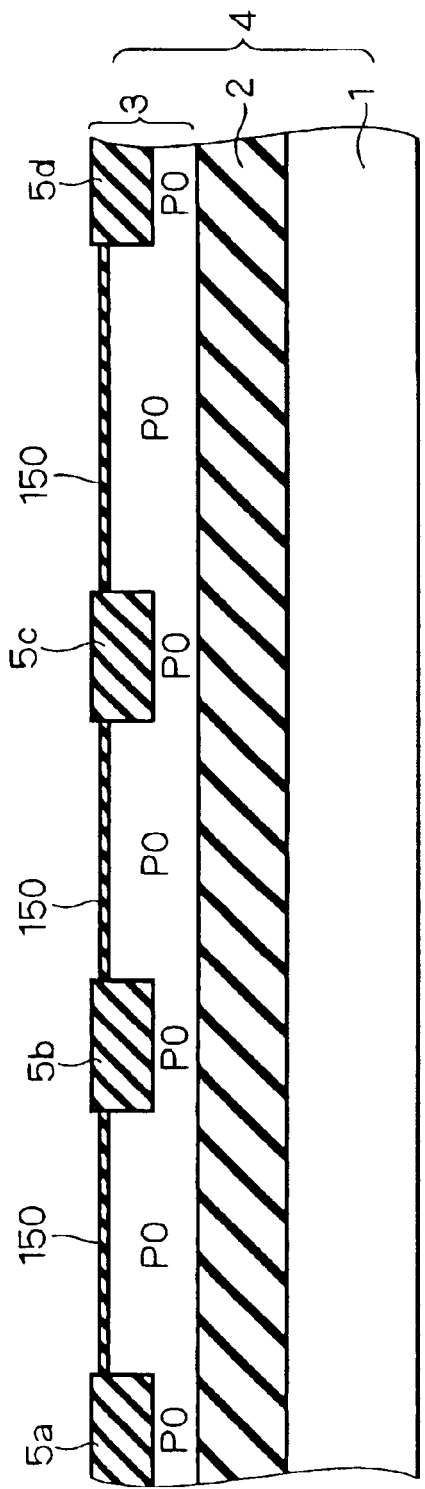
FIGS. 24 through 30 are sectional views illustrating a method of manufacturing a semiconductor device according to a fifth preferred embodiment of the present invention following the sequence of the steps thereof.

FIGS. 24 through 30 are sectional views illustrating a method of manufacturing a semiconductor device according to the fifth preferred embodiment following the sequence of the steps thereof. With reference to FIG. 24, the SOI substrate 4 is prepared first. Thereafter the element isolation insulating films 5a through 5d are provided. Similar to the first preferred embodiment, the silicon oxide film 150 remains on the upper surface of the silicon layer 3.

Figure 25:
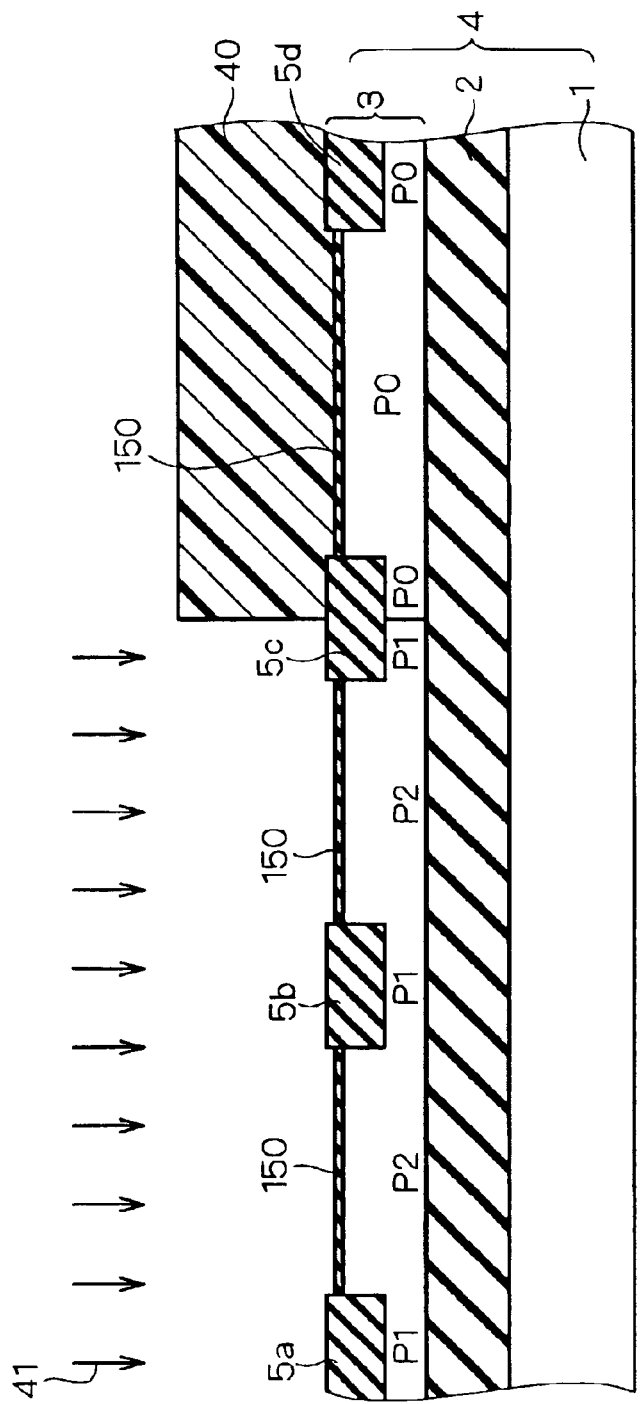

With reference to FIG. 25, a photoresist 40 is provided next by photolithography to cover the third element forming region. Thereafter using the photoresist 40 as a mask against implantation, a P-type impurity 41 is implanted by ion implantation process into the silicon layer 3 to a great depth, at a relatively high energy level allowing the impurity 41 to reach an interface between the silicon layer 3 and the BOX layer 2. As a result, in the first and second element forming regions, impurity-implanted regions having the impurity concentrations P1 and P2 are formed in the silicon layer 3. After this, the photoresist 40 is removed.

Figure 26:
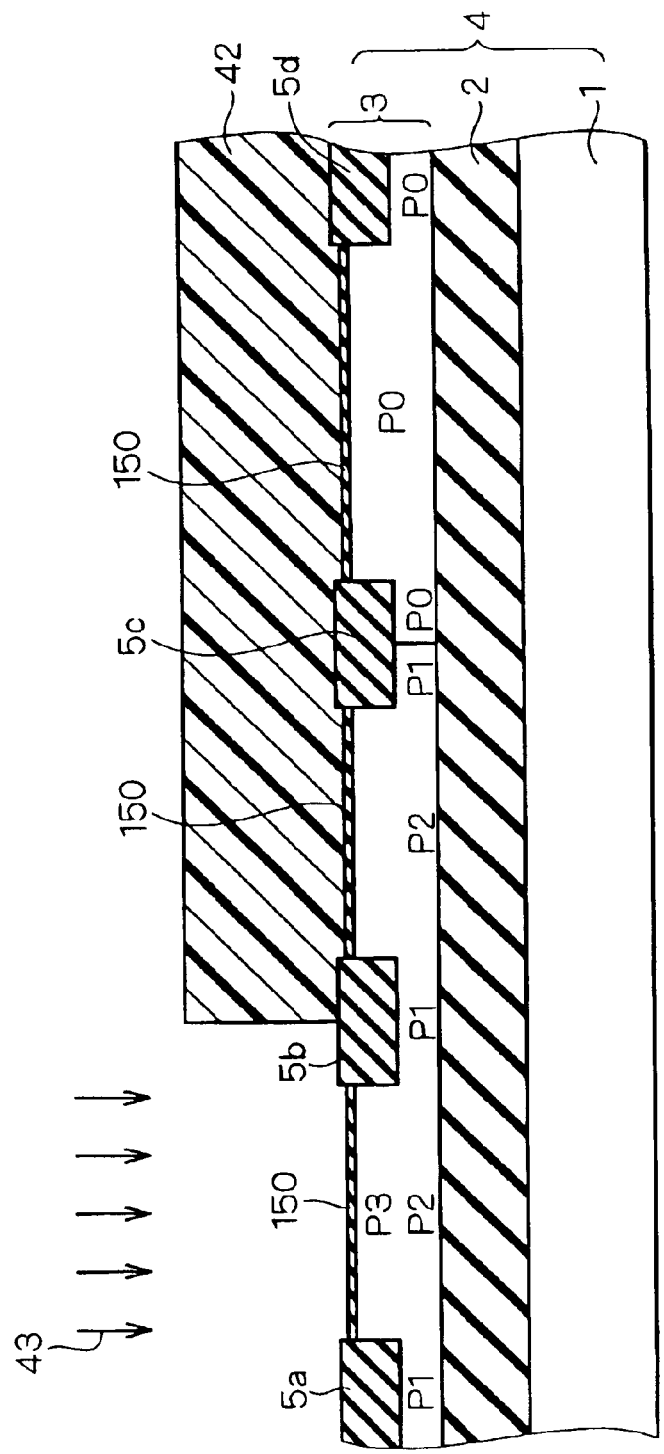

With reference to FIG. 26, a photoresist 42 is provided next by photolithography to cover the second and third element forming regions. Using the photoresist 42 as a mask against implantation, a P-type impurity 43 is thereafter implanted by ion implantation process into the upper surface of the silicon layer 3 to a shallow depth at a relatively low energy level. As a result, in the first element forming region, an impurity-implanted region having the impurity concentration P3 is formed in the upper surface of the silicon layer 3. After this, the photoresist 42 is removed.

Figure 27:
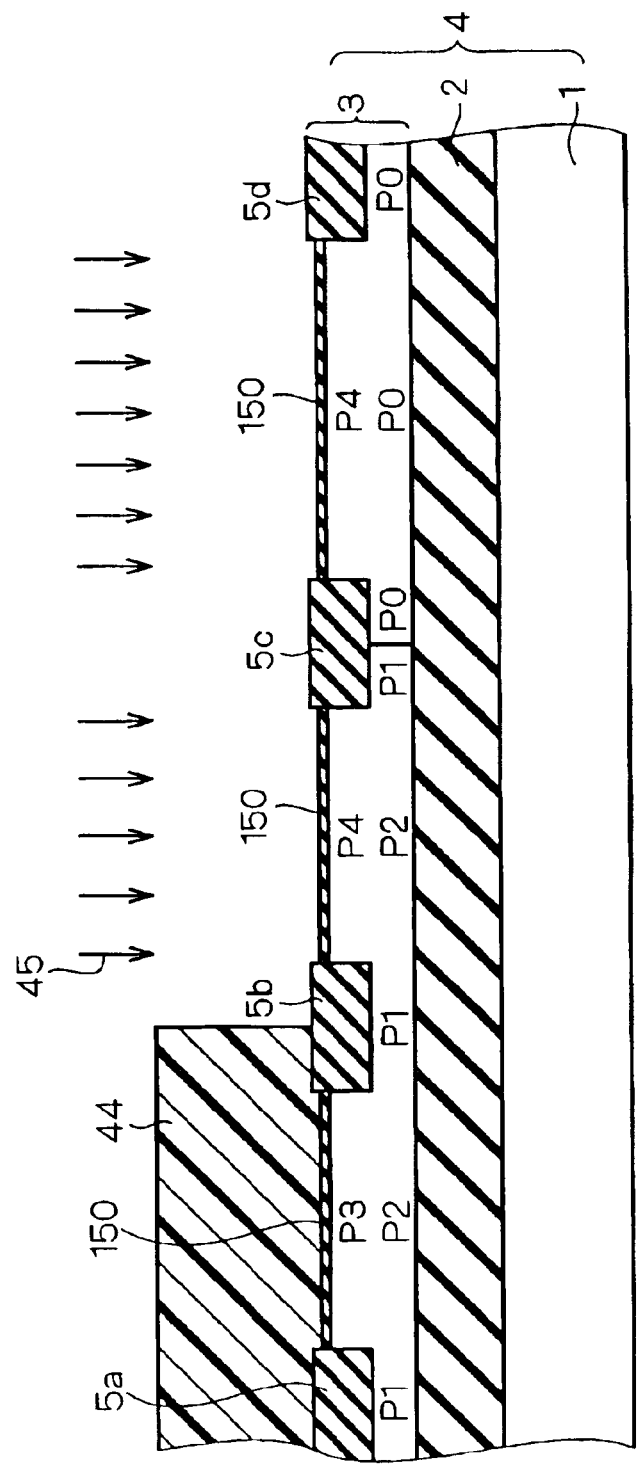

With reference to FIG. 27, a photoresist 44 is provided next by photolithography to cover the first element forming region. Using the photoresist 44 as a mask against implantation, a P-type impurity 45 is implanted by ion implantation process into the upper surface of the silicon layer 3 to a shallow depth at a relatively low energy level. As a result, in the second and third element forming regions, an impurity-implanted region having the impurity concentration P4 are formed in the upper surface of the silicon layer 3. After this, the photoresist 44 and the silicon oxide film 150 are removed.

Figure 28:
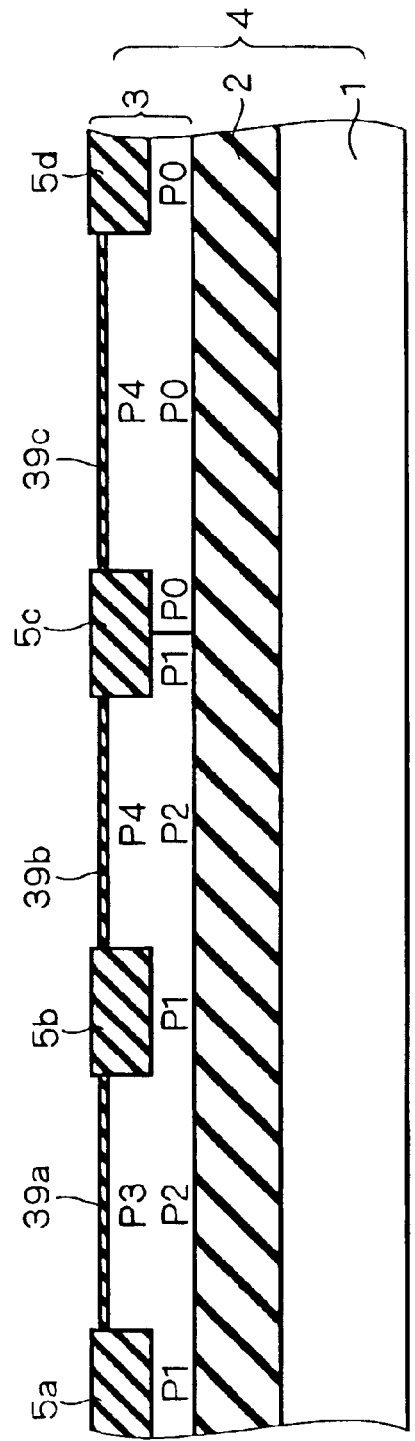

With reference to FIG. 28, in the first through third element forming regions, silicon oxide films 39a through 39c are subsequently provided by thermal oxidation process on the upper surface of the silicon layer 3.

Figure 29:
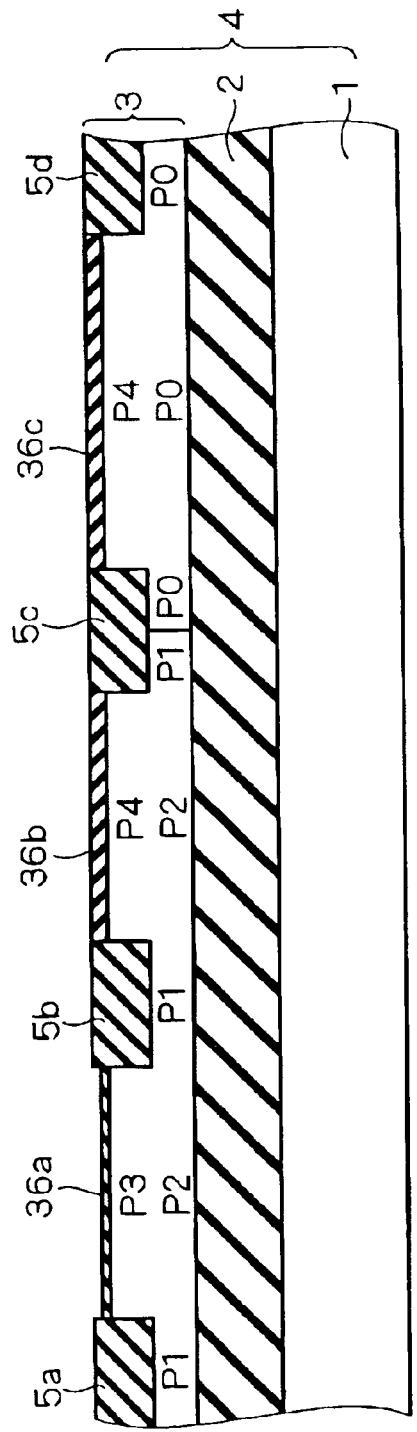

With reference to FIG. 29, the silicon oxide film 39a is then removed by photolithography and etching processes so that the upper surface of the silicon layer 3 is exposed in the first element forming region. In the first element forming region, the silicon oxide film 36a is thereafter provided on the upper surface of the silicon layer 3 by thermal oxidation process. Resulting from this thermal oxidation, the silicon oxide films 39b and 39c grow in thickness, to serve as the silicon oxide films 36b and 36c, respectively.

Figure 30:
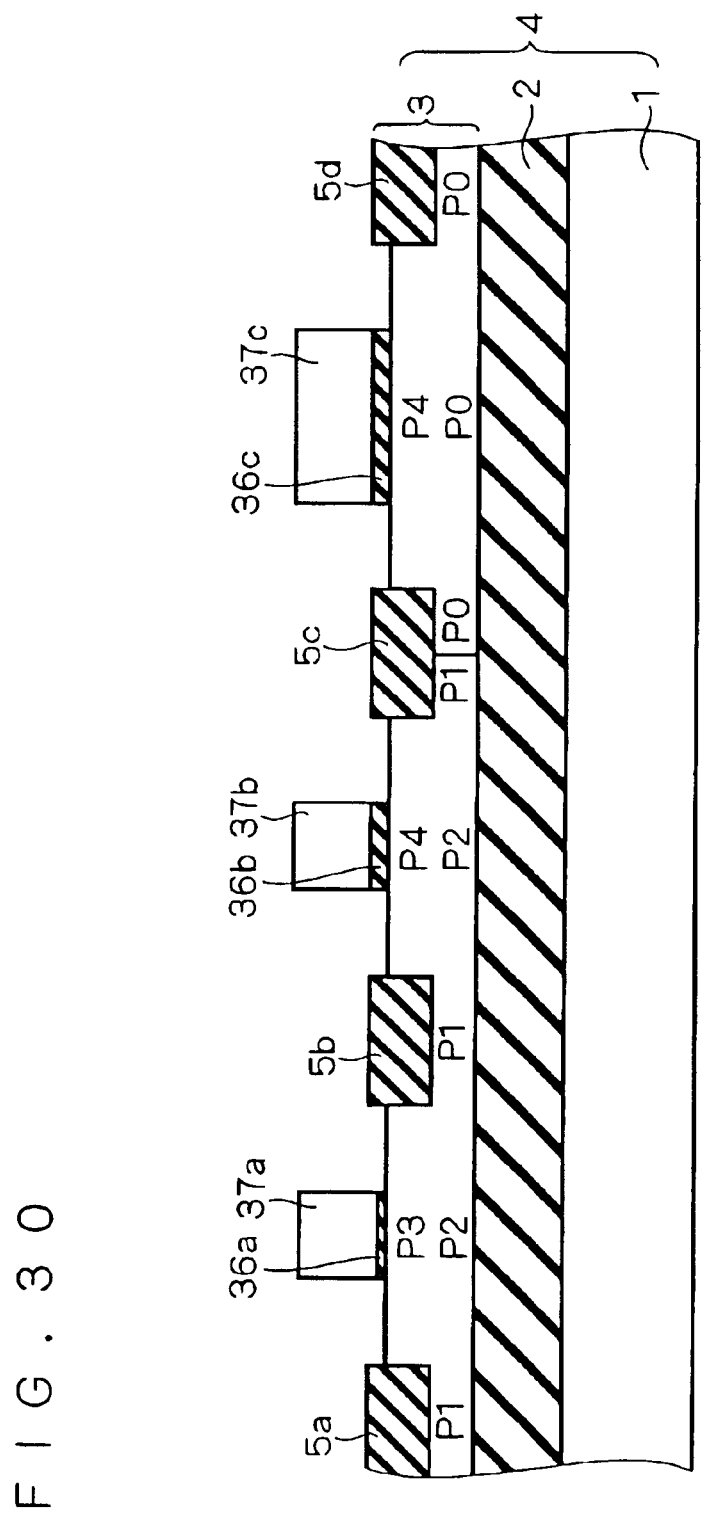

Next, with reference to FIG. 30, a polysilicon film is entirely provided, which is then patterned to form the gate electrodes 37a, 37b and the capacitor upper electrode 37c. Thereafter, N-type and P-type impurities are partially implanted by photolithography and ion implantation processes into the silicon layer 3, to form the source/drain regions 38a and 38b, and the contact regions 38c. The resultant structure thereby obtained is as given in FIG. 23.

As described, in the semiconductor device and the method of manufacturing the same according to the fifth preferred embodiment, the photoresist 40 is provided to cover the third element forming region, which is then used as a mask against implantation for implanting the P-type impurity 41 into the silicon layer 3 as shown in FIG. 25. Therefore, ion implantation of the P-type impurity 41 causes no damage to the silicon layer 3 in the third element forming region. As a result, reliability of the capacitor dielectric film 36c can be improved.

Further, the gate oxide film 36b and the capacitor dielectric film 36c each have a thickness larger than that of the gate oxide film 36a. As a result, the gate oxide film 36b and the capacitor dielectric film 36c are allowed to be more reliable than the gate oxide film 36a.

Sixth Preferred Embodiment

Figure 31:
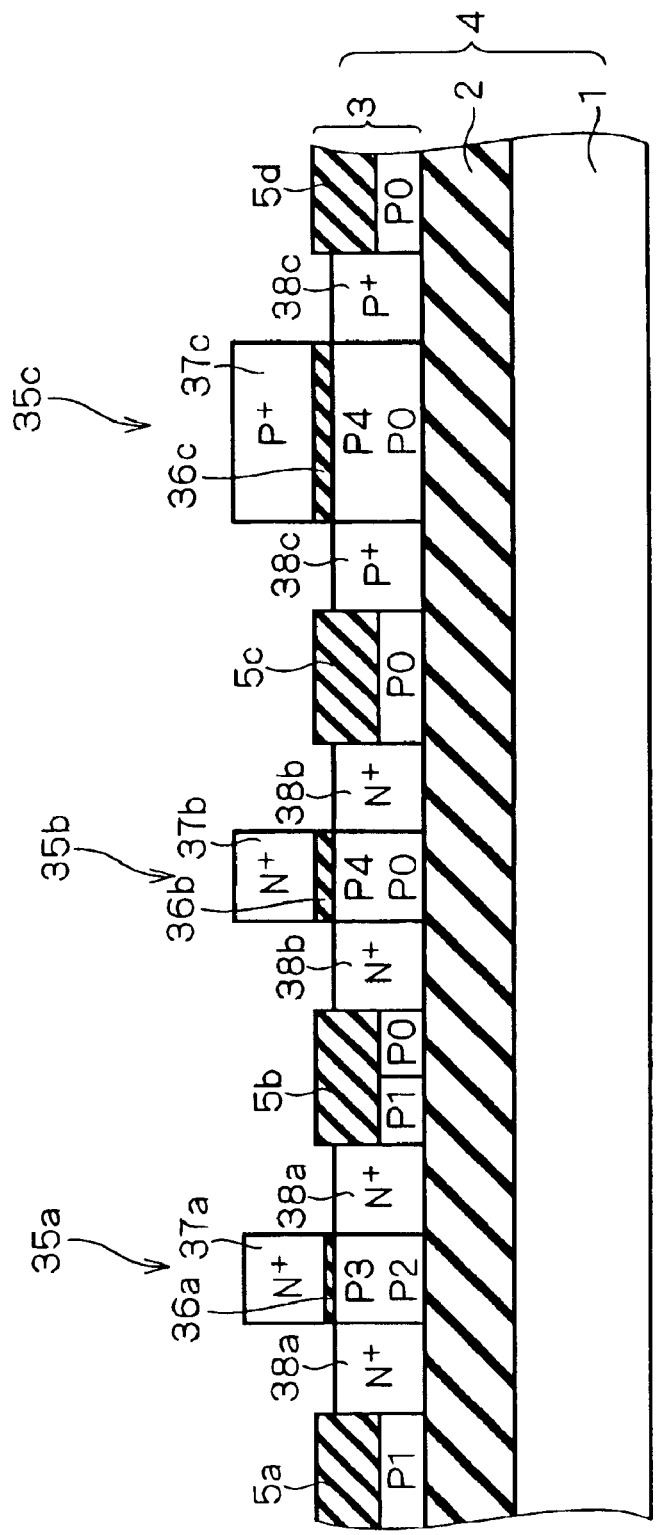
FIG. 31 is a sectional view illustrating the structure of a semiconductor device according to a sixth preferred embodiment of the present invention.

FIG. 31 is a sectional view illustrating the structure of a semiconductor device according to the sixth preferred embodiment of the present invention. In the sixth preferred embodiment, the silicon layer 3 does not include an impurity-implanted region having the impurity concentration P2 under the gate oxide film 36b. The impurity concentration in the silicon layer 3 under the gate oxide film 36b and in the vicinity of an interface between the silicon layer 3 and the BOX layer 2 is thus the concentration P0 which is the initial concentration of the silicon layer 3. As illustrated in FIG. 31, further, the silicon layer 3 has the impurity concentration P0 as the initial concentration of itself defined between the right half of the bottom surface of the element isolation insulating film 5b (namely, half of the bottom surface thereof on the side of the NMOSFET 35b) and the upper surface of the BOX layer 2. Still further, the silicon layer 3 has the impurity concentration P0 as the initial concentration of itself defined between the bottom surface of the element isolation insulating film 5c and the upper surface of the BOX layer 2. The structure of the semiconductor device of the sixth preferred embodiment is the same in the other respects as that of the semiconductor device of the fifth preferred embodiment given in FIG. 23.

Figure 32:
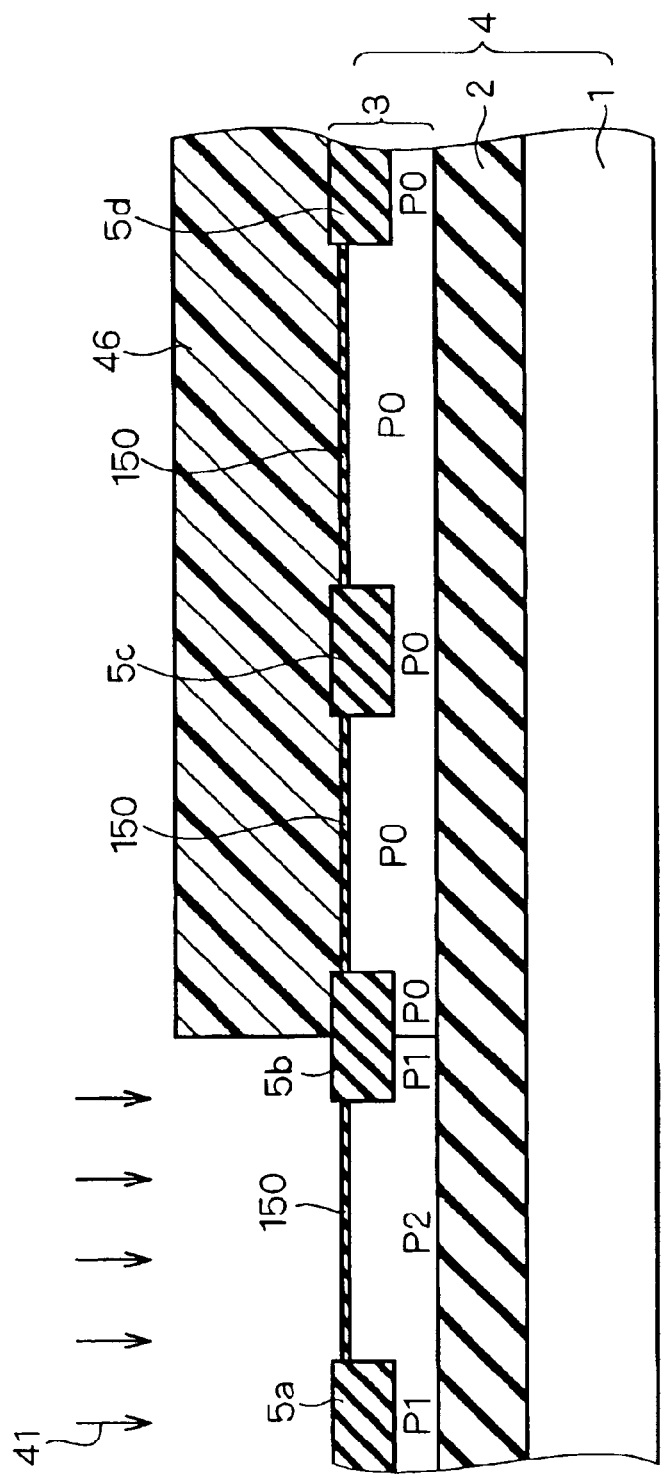
FIG. 32 is a sectional view illustrating one step of a method of manufacturing a semiconductor device according to the sixth preferred embodiment of the present invention.

FIG. 32 is a sectional view illustrating one step of a method of manufacturing a semiconductor device according to the sixth preferred embodiment. According to the method of the fifth preferred embodiment, in the step shown in FIG. 25, the photoresist 40 is provided to cover the third element forming region. In contrast, according to the method of the sixth preferred embodiment, a photoresist 46 is provided instead to cover the second and third element forming regions as in FIG. 32. Using the photoresist 46 as a mask against implantation, the P-type impurity 41 is implanted by ion implantation process.

As described, in the semiconductor device and the method of manufacturing the same according to the sixth preferred embodiment, ion implantation of the P-type impurity 41 causes no damage to the silicon layer 3 in the second element forming region. As a result, as compared with the fifth preferred embodiment, reliability of the gate oxide film 36b can be improved to a greater degree.

Seventh Preferred Embodiment

Figure 33:
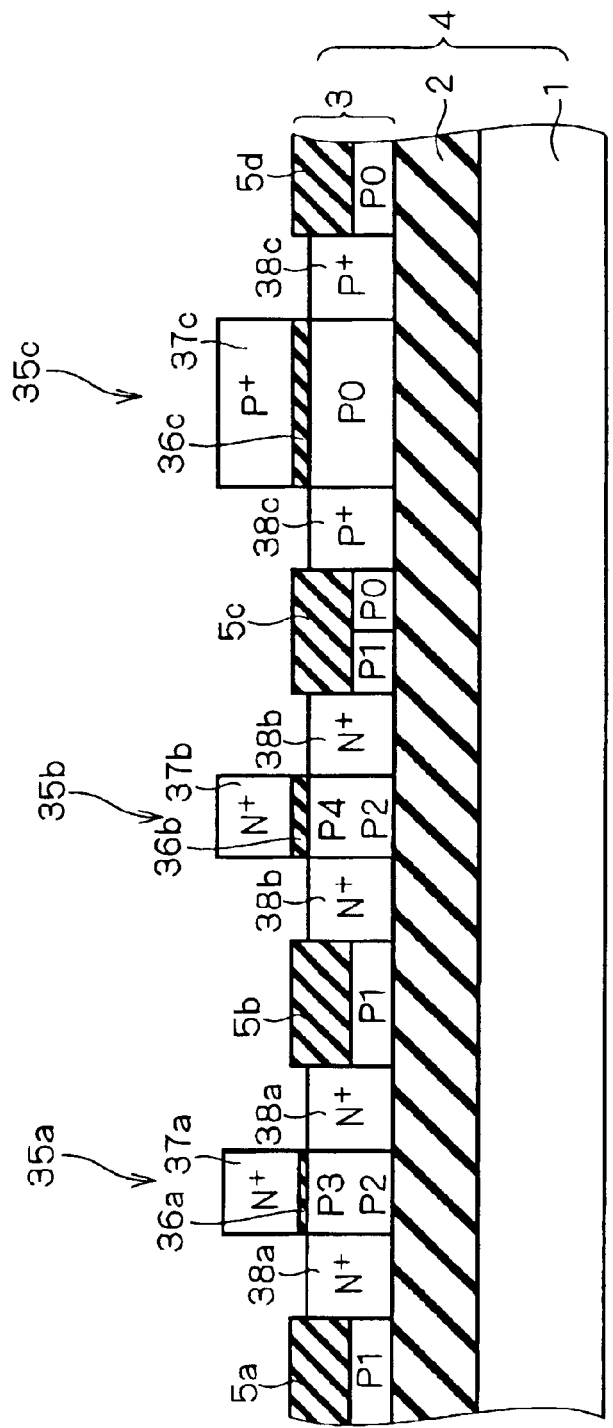
FIG. 33 is a sectional view illustrating the structure of a semiconductor device according to a seventh preferred embodiment of the present invention.

FIG. 33 is a sectional view illustrating the structure of a semiconductor device according to the seventh preferred embodiment of the present invention. In the seventh preferred embodiment, under the capacitor dielectric film 36c, the silicon layer 3 does not include an impurity-implanted region having the impurity concentration P4 in the upper surface thereof. Under the capacitor dielectric film 36c and in the vicinity of the upper surface of the silicon layer 3, the silicon layer 3 thus has the impurity concentration P0 which is the initial concentration of itself. The structure of the semiconductor device of the seventh preferred embodiment is the same in the other respects as that of the semiconductor device of the fifth preferred embodiment given in FIG. 23.

Figure 34:
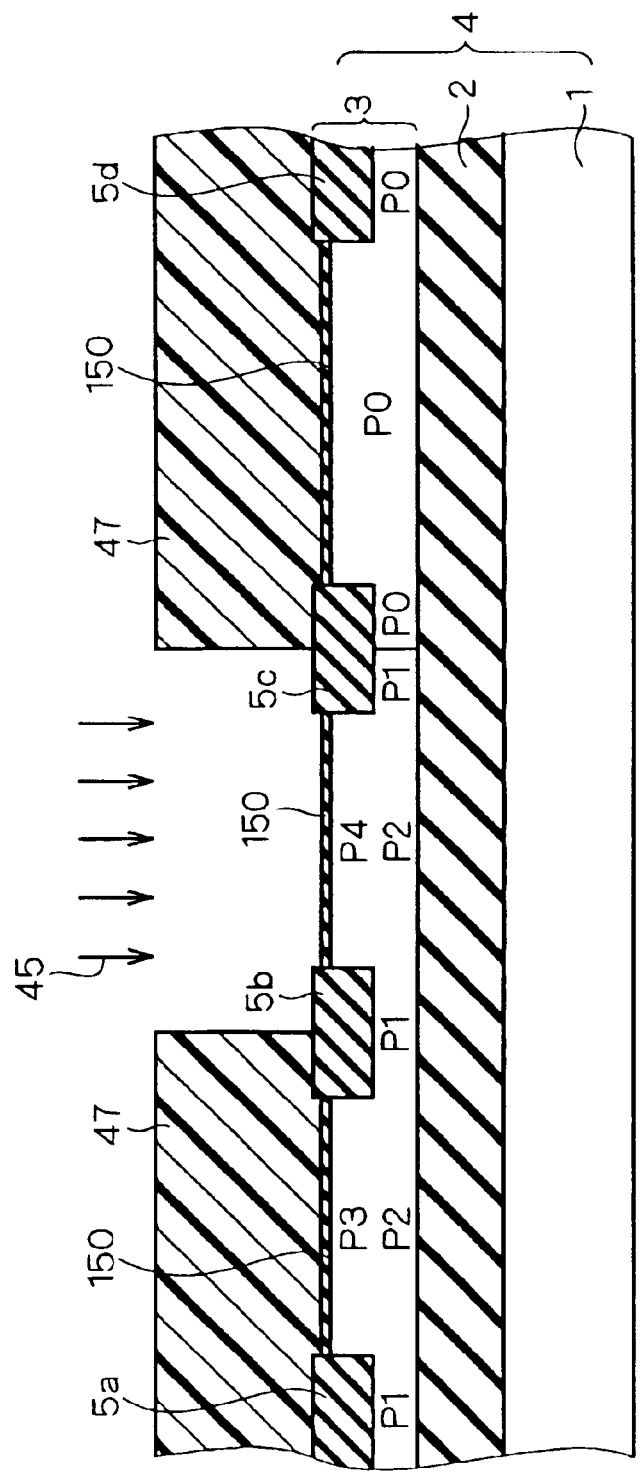
FIG. 34 is a sectional view illustrating one step of a method of manufacturing a semiconductor device according to the seventh preferred embodiment of the present invention.

FIG. 34 is a sectional view illustrating one step of a method of manufacturing a semiconductor device according to the seventh preferred embodiment. According to the method of the fifth preferred embodiment, in the step shown in FIG. 27, the photoresist 44 is provided to cover the first element forming region. In contrast, according to the method of the seventh preferred embodiment, a photoresist 47 is provided instead to cover the first and third element forming regions as in FIG. 34. Using the photoresist 47 as a mask against implantation, the P-type impurity 45 is implanted by ion implantation process.

As described, in the semiconductor device and the method of manufacturing the same according to the seventh preferred embodiment, damage to the silicon layer 3 in the third element forming region caused by the ion implantation of the P-type impurity 45 as well as damage to the silicon layer 3 in the third element forming region caused by the ion implantation of the P-type impurity 41 can be avoided. As a result, as compared with the fifth preferred embodiment, reliability of the capacitor dielectric film 36c can be improved to a greater degree.

Figure 35:
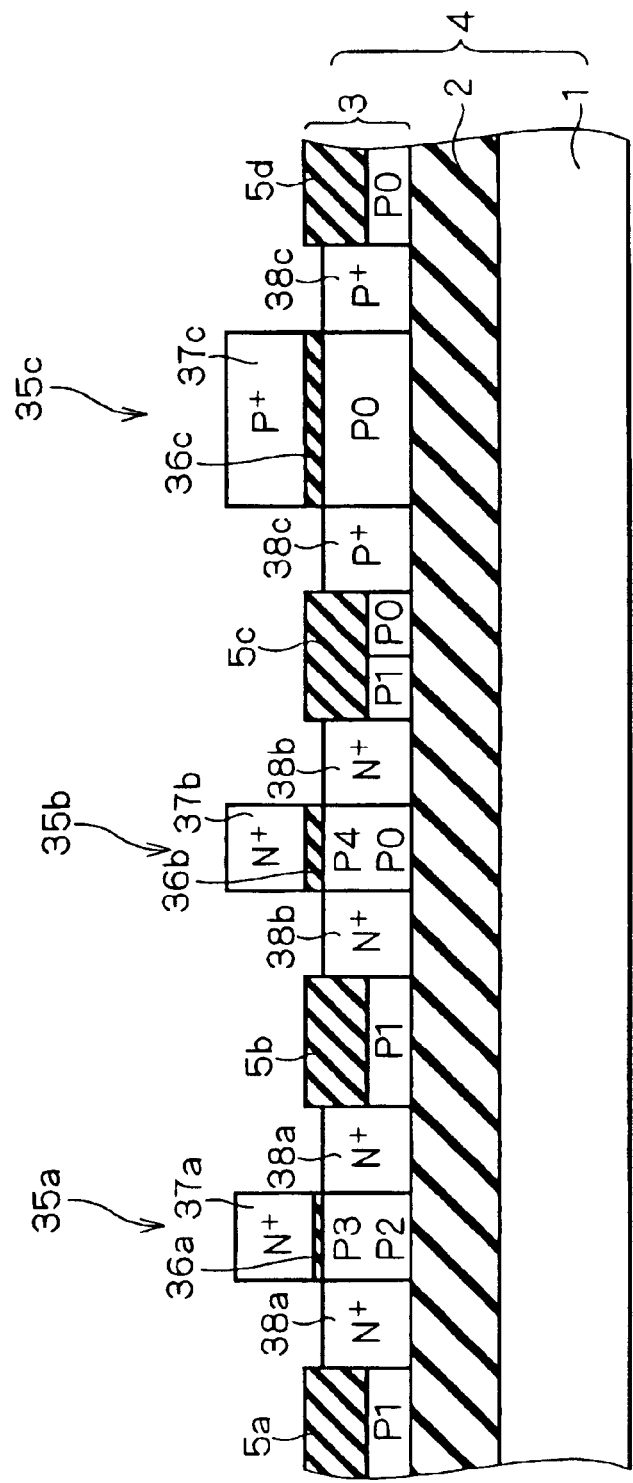
FIG. 35 is a sectional view illustrating a modification of the semiconductor device according to the seventh preferred embodiment of the present invention.

FIG. 35 is a sectional view illustrating a modification of the semiconductor device according to the seventh preferred embodiment, realized by the combination of the sixth and seventh preferred embodiments. In contrast to the semiconductor device of the fifth preferred embodiment, in the semiconductor device of this modification, the silicon layer 3 does not include an impurity-implanted region having the impurity concentration P2 under the gate oxide film 36b. Further, the silicon layer 3 does not include an impurity-implanted region having the impurity concentration P4 under the capacitor dielectric film 36c. The modification thereby produces the effects obtained by both the sixth and seventh preferred embodiments.

Eighth Preferred Embodiment

Figure 36:
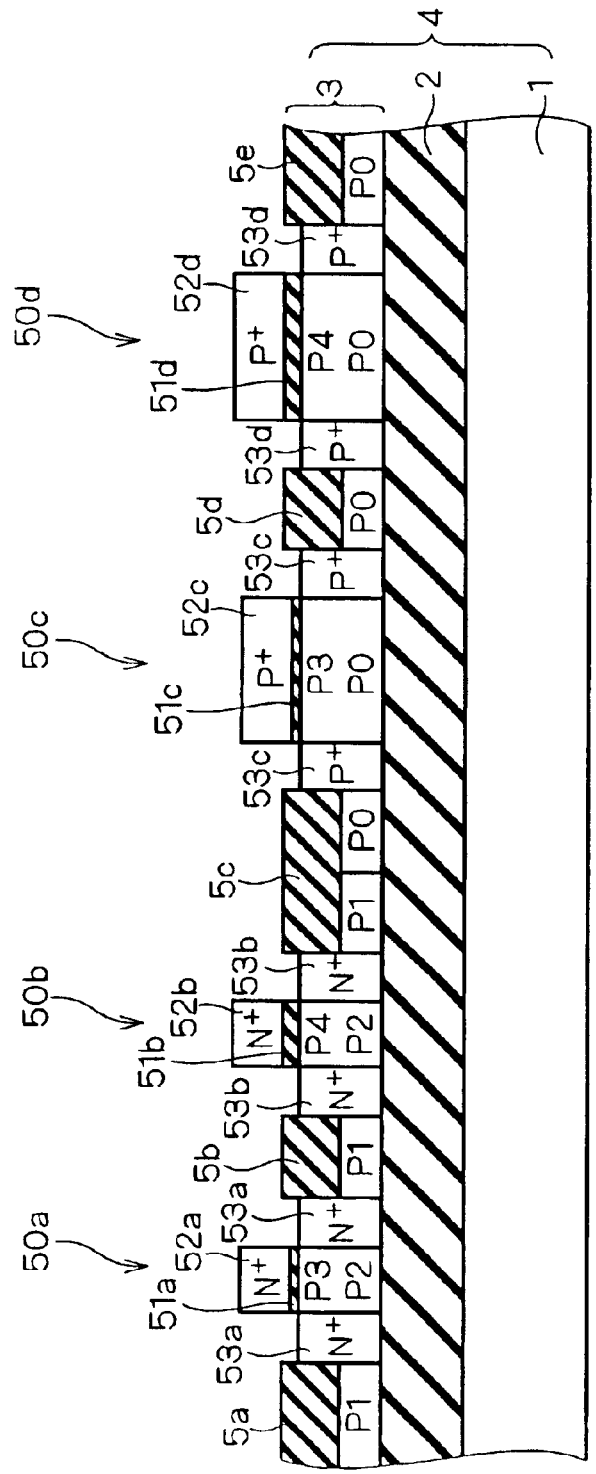
FIG. 36 is a sectional view illustrating the structure of a semiconductor device according to an eighth preferred embodiment of the present invention.

FIG. 36 is a sectional view illustrating the structure of a semiconductor device according to the eighth preferred embodiment of the present invention. The semiconductor device of the eighth preferred embodiment includes the SOI substrate 4, the element isolation insulating films 5a through 5e of partial isolation type, NMOSFETs 50a and 50b, and MOS capacitors 50c and 50d. The NMOSFET 50a is provided in the first element forming region, the NMOSFET 50b is in the second element forming region, the MOS capacitor 50c is in the third element forming region, and the MOS capacitor 50d is in the fourth element forming region.

The NMOSFET 50a forms a low voltage circuit, and the NMOSFET 50b forms a high voltage circuit. In the semiconductor device of the eighth preferred embodiment, the MOS capacitor 50c corresponding to the low voltage circuit and the MOS capacitor 50d corresponding to the high voltage circuit are individually formed, to stabilize the operations of the device. The MOS capacitor 50c is connected to the low voltage circuit, and the MOS capacitor 50d is connected to the high voltage circuit.

A gate oxide film 51b and capacitor dielectric films 51c, 51d are required to be more reliable than a gate oxide film 51a. The gate oxide film 51b and the capacitor dielectric film 51d each have a thickness larger than that of the gate oxide film 51a.

When a P-type impurity is implanted by ion implantation process into the lower part of the silicon layer 3 in the first and second element forming regions, the third and fourth element forming regions are covered with a photoresist. As a result, under the capacitor dielectric films 51c and 51d, and in the vicinity of an interface between the silicon layer 3 and the BOX layer 2, the silicon layer 3 has the impurity concentration P0 which is the initial concentration of itself.

As one modification of the eighth preferred embodiment, when a P-type impurity is implanted by ion implantation process into the upper part of the silicon layer 3 in the first element forming region, at least the third element forming region may be covered with a photoresist. In the silicon layer 3, it is thereby allowed to avoid formation of an impurity-implanted region having the impurity concentration P3 under the capacitor dielectric film 51c.

As another modification of the eighth preferred embodiment, when a P-type impurity is implanted by ion implantation process into the upper part of the silicon layer 3 in the second element forming region, at least the fourth element forming region may be covered with a photoresist. In the silicon layer 3, it is thereby allowed to avoid formation of an impurity-implanted region having the impurity concentration P4 under the capacitor dielectric film 51d.

Figure 37:
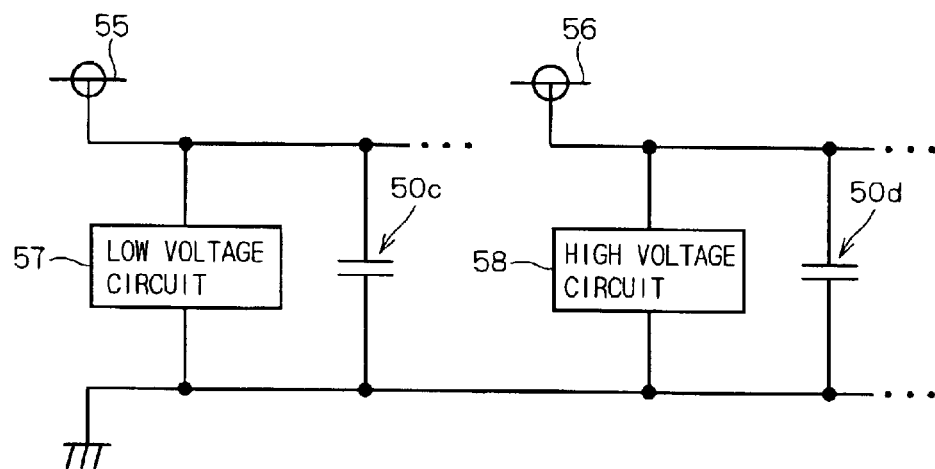
FIG. 37 is a circuit diagram showing a first exemplary circuit employing the semiconductor device according to the eighth preferred embodiment of the present invention.

FIG. 37 is a circuit diagram showing a first exemplary circuit employing the semiconductor device according to the eighth preferred embodiment. A low voltage circuit 57 and a high voltage circuit 58 includes the NMOSFET 50a and NMOSFET 50b shown in FIG. 36, respectively. A power source 55 is connected to the low voltage circuit 57 for applying a relatively low source potential thereto. A power source 56 is connected to the high voltage circuit 58 for applying a relatively high source potential thereto. A common line is connected to the low voltage circuit 57 and the high voltage circuit 58 for applying a ground potential thereto. The MOS capacitor 50c is interposed between the power source 55 and the common line, and serves as a decoupling capacitor for the low voltage circuit 57. The MOS capacitor 50d is interposed between the power source 56 and the common line, and serves as a decoupling capacitor for the high voltage circuit 58.

Figure 38:
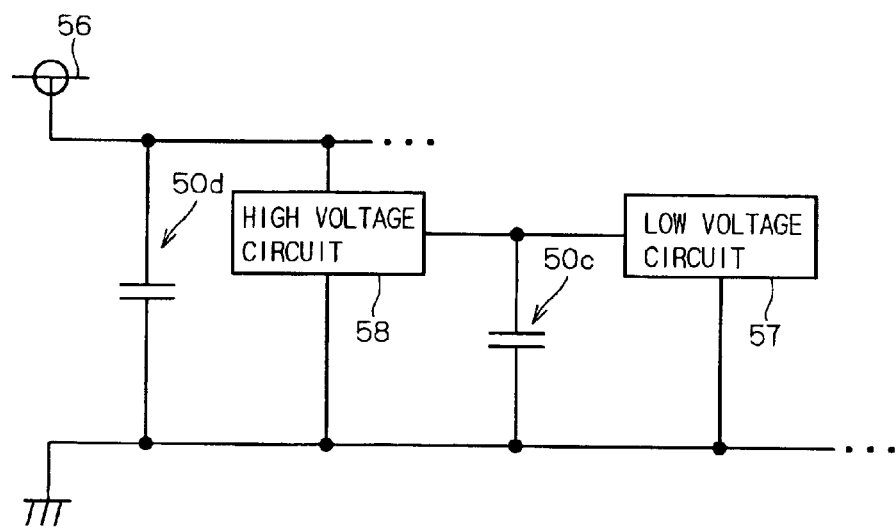
FIG. 38 is a circuit diagram showing a second exemplary circuit employing the semiconductor device according to the eighth preferred embodiment of the present invention.

FIG. 38 is a circuit diagram showing a second exemplary circuit employing the semiconductor device according to the eighth preferred embodiment. In contrast to the circuit shown in FIG. 37 including the two power sources 55 and 56, the circuit in FIG. 38 only includes the power source 56. The source potential of the power source 56 is down converted by the high voltage circuit 58, which is then applied to the low voltage circuit 57. Namely, in the circuit shown in FIG. 38, the high voltage circuit 58 serves as a power source for the low voltage circuit 57.

As described, according to the semiconductor device and the method of manufacturing the same of the eighth preferred embodiment, the following effect can be obtained in the semiconductor integrated circuit including the MOS capacitor 50c for the low voltage circuit 57 and the MOS capacitor 50d for the high voltage circuit 58 that are individually formed. That is, damage to the silicon layer 3 caused by the ion implantation can be suppressed or avoided, thereby improving reliability of the capacitor dielectric films 51c and 51d. As a result, it is allowed to improve reliability of the capacitor of the semiconductor integrated circuit and eventually, improve reliability of the semiconductor integrated circuit itself.

Ninth Preferred Embodiment

Figure 39:
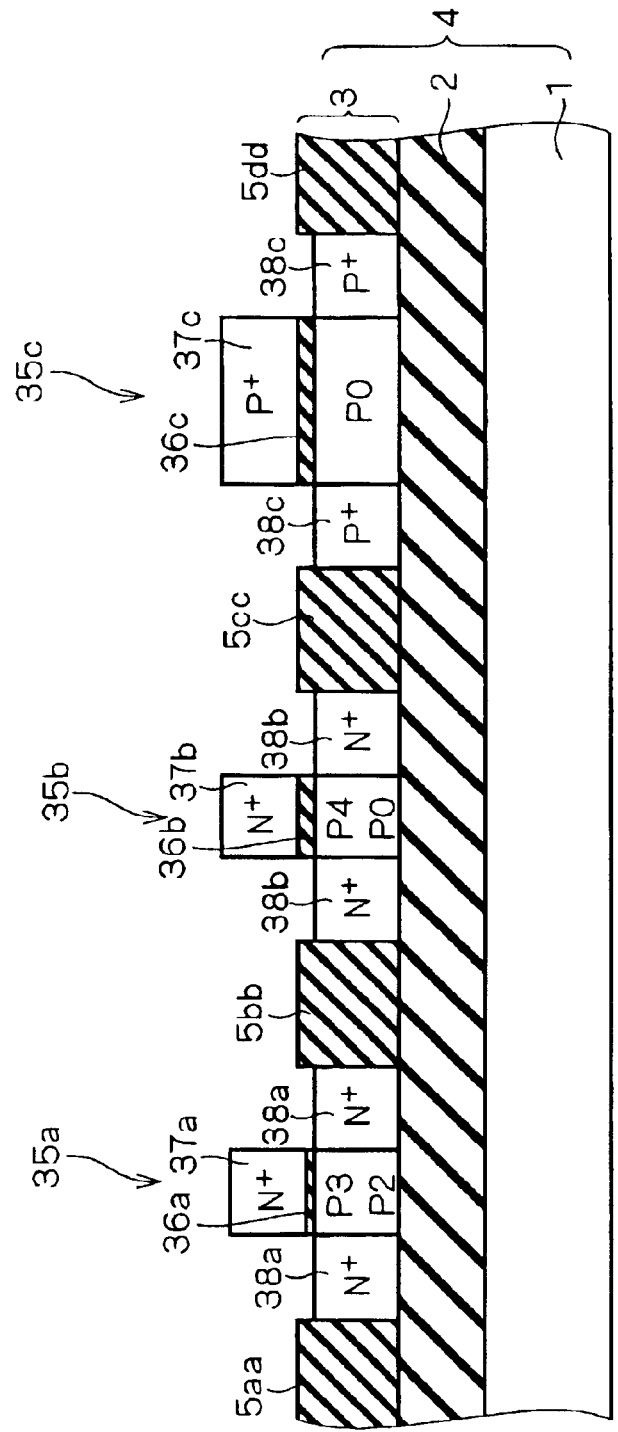
FIG. 39 is a sectional view illustrating the structure of a semiconductor device according to a ninth preferred embodiment of the present invention.

FIG. 39 is a sectional view illustrating the structure of a semiconductor device according to the ninth preferred embodiment of the present invention. In the semiconductor device according to the first, second and fifth through eighth preferred embodiments, the element isolation insulating films 5a through 5e of partial isolation type are provided in the upper surface of the silicon layer 3 of the SOI substrate 4. In contrast, in the semiconductor device according to the ninth preferred embodiment, element isolation insulating films 5aa through 5dd are provided instead. The bottom surfaces of the element isolation insulating films 5aa through 5dd each have contact with the upper surface of the BOX layer 2. The element isolation insulating film arranged in this manner is called as "an element isolation insulating film of complete isolation type".

As described, the semiconductor device of the ninth preferred embodiment includes the element isolation insulating films 5aa through 5dd of complete isolation type. Therefore, as compared with the semiconductor device of the first, second and fifth through eighth preferred embodiments, the element isolation effectiveness can be improved.

Tenth Preferred Embodiment

In the semiconductor device of the first, second and fifth through eighth preferred embodiments, no impurity for element isolation is implanted into the capacitor, to improve reliability of the capacitor dielectric film. However, the semiconductor device of the first, second and fifth through eighth preferred embodiments includes the element isolation insulating films 5a through 5e of partial isolation type. Therefore, depending on the layout of the semiconductor elements, a defect may be caused in a circuit. As an example of such probable defect, FIG. 11 may be referred to. In FIG. 11, the PMOSFET 13a and the MOS capacitor 13b having the N-type contact regions 9b are provided adjacent to each other. In this case, a $P^+$-N1-P0-$N^+$ parasitic thyristor structure is generated in the silicon layer 3, causing the probability of latch-up. In view of this, in the tenth preferred embodiment of the present invention, a semiconductor device preventing such detect is suggested.

Figure 40:
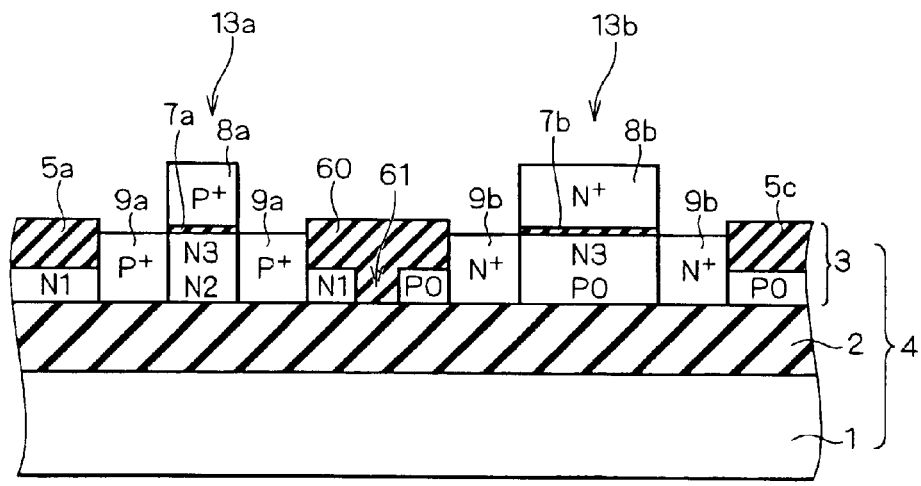
FIG. 40 is a sectional view illustrating the structure of a semiconductor device according to a tenth preferred embodiment of the present invention.

On the basis of the structure given in FIG. 11, for example, the semiconductor device according to the tenth preferred embodiment is given in the sectional view of FIG. 40. Instead of the element isolation insulating film 5b of partial isolation type, an element isolation insulating film 60 is provided between the PMOSFET 13a and the MOS capacitor 13b. The element isolation insulating film 60 partially includes in the bottom surface thereof a portion 61 for complete isolation contacting the upper surface of the BOX layer 2. The element isolation insulating film 60 thereby serves as an element isolation insulating film of complete isolation type.

As described, in the semiconductor device according to the tenth preferred embodiment, the element isolation insulating film 60 of complete isolation type is provided between the MOSFET and the MOS capacitor adjacent to each other. Therefore, even when the PMOSFET and the MOS capacitor including the N-type contact region are provided to be adjacent to each other, no parasitic thyristor structure is generated. As a result, generation of latch-up can be prevented.

In the first through tenth preferred embodiments, the description and illustration have been given referring to the simplified structures of the MOSFET and the MOS capacitor. However, in the part of the substrate under the region to hold therein an insulating film, the object of the present invention is to suppress or avoid damage to the substrate caused by ion implantation, to improve reliability of the insulating film provided on the main surface of the substrate. Therefore, the present invention is further applicable to a semiconductor device having an LDD structure (or extension structure) or a silicide structure, and the method of manufacturing the same.

Figure 41:
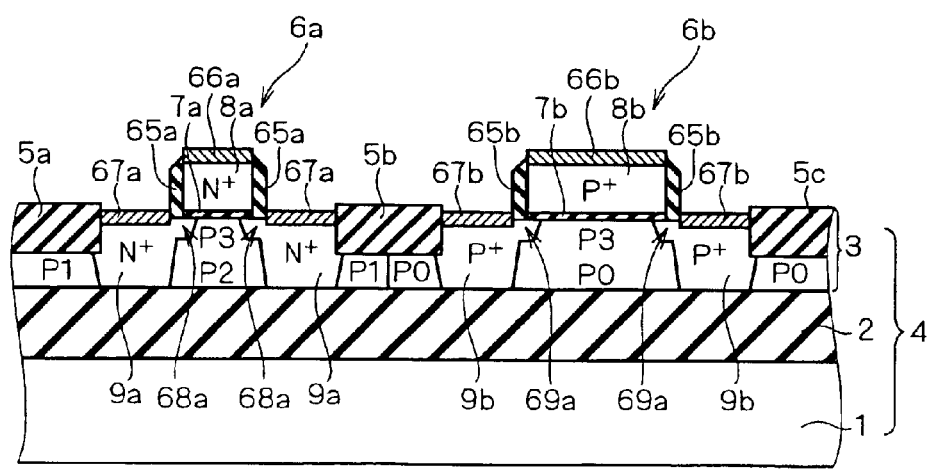
FIG. 41 is a sectional view illustrating a modification of the semiconductor device according to the first through tenth preferred embodiments of the present invention.
Figure 42:
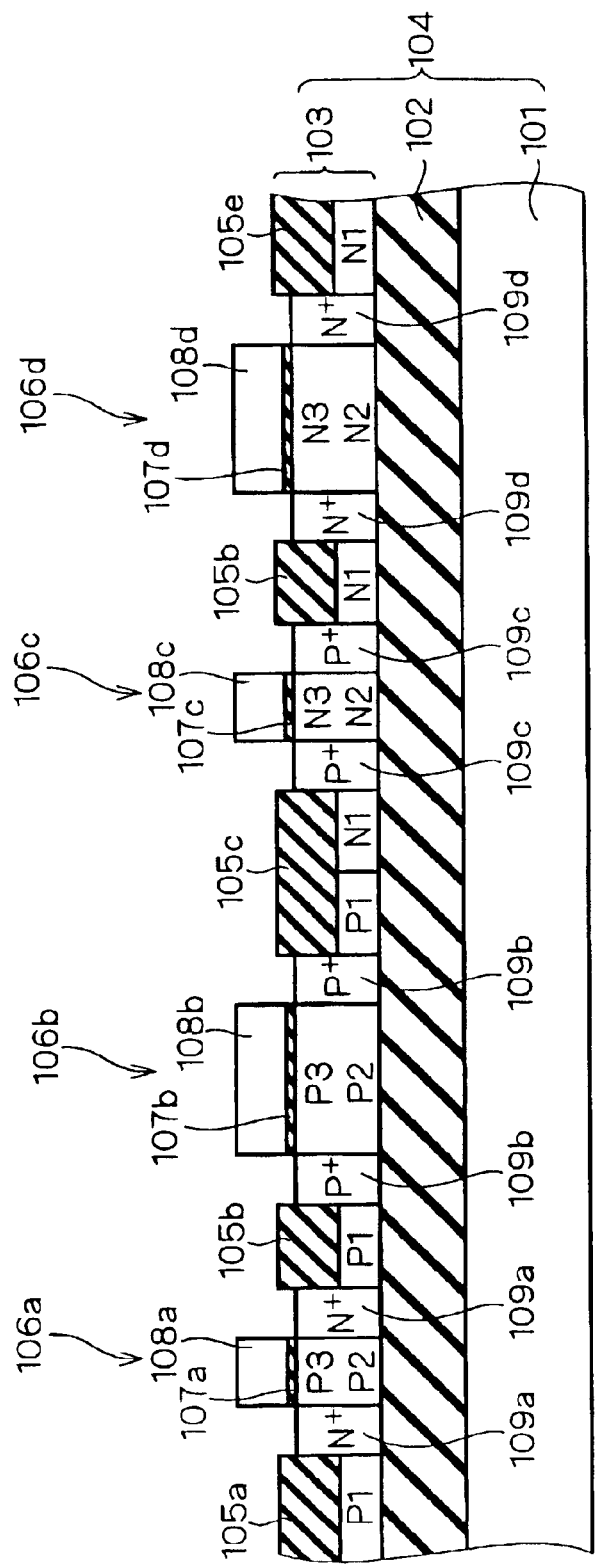
FIG. 42 is a sectional view illustrating the structure of the first semiconductor device in the prior art.
Figure 43:
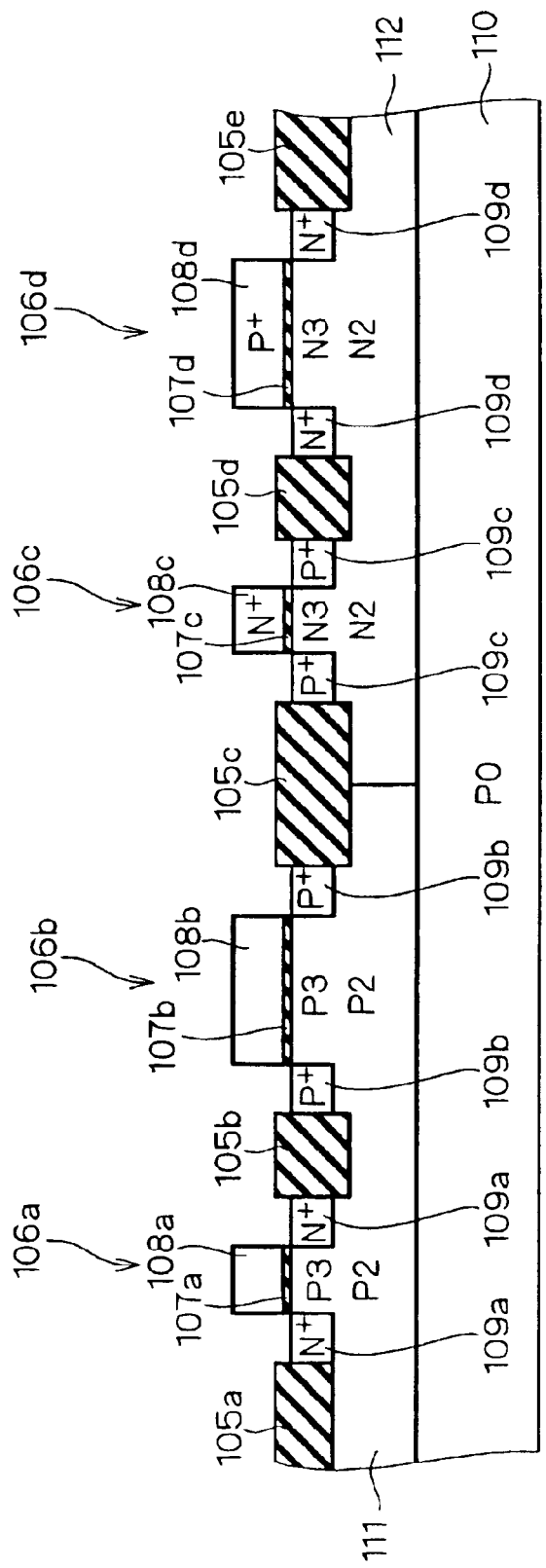
FIG. 43 is a sectional view illustrating the structure of the second semiconductor device in the prior art.

FIG. 41 is a sectional view illustrating a modification of the semiconductor device according to the first through tenth preferred embodiments. A sidewall 65a is provided on each side surface of the gate electrode 8a, and a sidewall 65b is on each side surface of the capacitor upper electrode 8b. Silicide layers 66a and 66b are provided on the upper surfaces of the gate electrode 8a and the capacitor upper electrode 8b, respectively. The source/drain regions 9a include extension regions 68a, and the contact regions 9b include extension regions 69a. A silicide layer 67a is provided on each upper surface of the source/drain regions 9a, and a silicide layer 67b is on each upper surface of the contact regions 9b.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
an SOI substrate including a support substrate, an insulating layer, and a semiconductor layer stacked in this order, said semiconductor layer having a first impurity concentration of a predetermined conductivity type;
a first MOSFET provided in a first element fanning region of said SOI substrate, said first MOSFET including a first gate insulating film provided on a main surface of said semiconductor layer;
a first impurity-injected region of said predetermined conductivity type, said first impurity-injected region being provided under said first gate insulating film, extending in said semiconductor layer from a certain depth from said main surface to a depth greater than said certain depth; and
a first MOS capacitor provided in a second element forming region of said SOI substrate, said first MOS capacitor including a first capacitor dielectric film provided on said main surface, wherein
said first impurity-injected region has a first impurity concentration distribution being higher than said first impurity concentration, and
said semiconductor layer has a second impurity concentration distribution under said first capacitor dielectric film, said second impurity concentration distribution being equal to said first impurity concentration and uniformly extending in a depth direction from at least a certain depth from said main surface to a contact surface between said semiconductor layer and said insulating layer.

2. The semiconductor device according to claim 1, wherein
said second impurity concentration distribution extends from said main surface to said contact surface.

3. The semiconductor device according to claim 1, further comprising:
a second impurity-injected region of said predetermined conductivity type, said second impurity-injected region being provided under said first gate insulating film, extending in said main surface shallower than said first impurity-injected region; and
a third impurity-injected region of said predetermined conductivity type, said third impurity-injected region being provided under said first capacitor dielectric film, extending in said main surface shallower than said first impurity-injected region.

4. The semiconductor device according to claim 1, further comprising:
a second MOSFET provided in a third element forming region of said SOI substrate, said second MOSFET including a second gate insulating film provided on said main surface;
a second impurity-injected region of said predetermined conductivity type, said second impurity-injected region being provided under said second gate insulating film, extending in said semiconductor layer from a certain depth from said main surface to a depth greater than said certain depth; and
a second MOS capacitor provided in a fourth element forming region of said SOI substrate, said second MOS capacitor including a second capacitor dielectric film provided on said main surface, wherein
said first MOSFET forms a first semiconductor circuit driven by a first voltage,
said first MOS capacitor is connected to said first semiconductor circuit,
said second MOSFET forms a second semiconductor circuit driven by a second voltage higher than said first voltage,
said second MOS capacitor is connected to said second semiconductor circuit,
said second impurity-injected region has a third impurity concentration distribution being higher than said first impurity concentration, and
said semiconductor layer has a fourth impurity concentration distribution under said second capacitor dielectric film, said fourth impurity concentration distribution being equal to said first impurity concentration and uniformly extending in a depth direction from at least a certain depth from said main surface to a contact surface between said semiconductor layer and said insulating layer.

5. The semiconductor device according to claim 4, further comprising:
a first power source for supplying said first voltage to said first semiconductor circuit;
a second power source for supplying said second voltage to said second semiconductor circuit; and
a common line connected to said first and second semiconductor circuits, wherein
said first MOS capacitor is interposed between said first power source and said common line, and
said second MOS capacitor is interposed between said second power source and said common line.

6. A semiconductor device, comprising:
a semiconductor substrate having a first impurity concentration of a predetermined conductivity type;
a MOSFET provided in a first element forming region of said semiconductor substrate, said MOSFET including a gate insulating film provided on a first main surface of said semiconductor substrate;
an impurity-injected region of said predetermined conductivity type, said impurity-injected region being provided under said gate insulating film, extending in said first main surface; and
an MOS capacitor provided in a second element forming region of said semiconductor substrate, said MOS capacitor including a capacitor dielectric film provided on said first main surface, wherein
said impurity-injected region has a first impurity concentration distribution being higher than said first impurity concentration, and
said semiconductor substrate has a second impurity concentration distribution under said capacitor dielectric film, said second impurity concentration distribution being equal to said first impurity concentration and uniformly and entirely extending in a depth direction from said first main surface to a second main surface opposite to said first main surface.

* * * * *